US007661923B2

United States Patent
Kosugi

(10) Patent No.: US 7,661,923 B2
(45) Date of Patent: *Feb. 16, 2010

(54) CASING, EQUIPMENT UNIT AND FAN UNITS PROVIDED WITH THE CASING, AND ELECTRONIC EQUIPMENT PROVIDED WITH THE FAN UNITS

(75) Inventor: Naofumi Kosugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 180 days.

This patent is subject to a terminal disclaimer.

(21) Appl. No.: 11/295,522

(22) Filed: Dec. 7, 2005

(65) Prior Publication Data

US 2006/0083606 A1 Apr. 20, 2006

Related U.S. Application Data

(63) Continuation of application No. 10/740,797, filed on Dec. 22, 2003, now Pat. No. 7,048,498.

(30) Foreign Application Priority Data

Jan. 28, 2003 (JP) ............................. 2003-019431

(51) Int. Cl.
*F04D 29/52* (2006.01)
(52) U.S. Cl. .................... 415/118; 415/126; 415/121.2; 415/213.1; 415/214.1; 206/470; 220/4.23; 220/837
(58) Field of Classification Search ................. 415/118, 415/126, 121.1, 213.3, 214.4, 220; 417/423.14; 206/307.1, 308.3, 721, 760, 387.13, 470; 361/695; 220/4.22, 4.23, 836, 837
See application file for complete search history.

(56) References Cited

U.S. PATENT DOCUMENTS 3,339,781 A * 9/1967 Confer et al. ................ 206/592

(Continued)

FOREIGN PATENT DOCUMENTS

CN 2523174 11/2002

(Continued)

OTHER PUBLICATIONS

Japanese Patent Office Action, mailed Jun. 24, 2008 and issued in corresponding Japanese Patent Application No. 2003-019431.

*Primary Examiner*—Ninh H Nguyen
(74) *Attorney, Agent, or Firm*—Staas & Halsey LLP

(57) ABSTRACT

The invention provides a casing, equipment unit, fan unit and electronic equipment capable of easily implementing assembling, disassembling, attaching and so forth without using fixture components, tools, and so forth. The structure is made up of casing sections, hinge parts and a coupling part. The casing sections are made up of not less than two sections and enclosing a hosing space, and members for securing the housing space thereby. The hinge parts are members coupled with the casing sections and supporting each casing section. That is, not less than two casing sections couple the edge parts of each casing section, and bendably support each casing section. The coupling part is a member for restraining the casing sections positionally and maintaining and fixing the housing space. That is, the coupling parts detachably couple each casing section to hold the housing space on each casing section.

13 Claims, 26 Drawing Sheets

U.S. PATENT DOCUMENTS

| | | | |
|---|---|---|---|
| 3,616,487 A * | 11/1971 | Dearth | 16/225 |
| 3,937,389 A * | 2/1976 | Wind | 229/406 |
| 4,793,643 A | 12/1988 | Ahad et al. | |
| 5,456,632 A | 10/1995 | Ohtsu et al. | |
| 5,788,467 A * | 8/1998 | Zenitani et al. | 417/360 |
| 5,822,186 A | 10/1998 | Bull et al. | |
| 6,040,981 A | 3/2000 | Schmitt et al. | |
| 6,186,319 B1 * | 2/2001 | Schmidt et al. | 206/232 |
| 6,236,564 B1 * | 5/2001 | Fan | 361/695 |
| 6,322,042 B1 | 11/2001 | Nemec | |
| 6,330,154 B1 | 12/2001 | Fryers et al. | |
| 6,373,698 B1 * | 4/2002 | Christensen | 361/695 |
| 6,375,440 B2 | 4/2002 | Kosugi | |
| 6,462,948 B1 | 10/2002 | Leija et al. | |
| 6,525,937 B2 | 2/2003 | Yanagida | |
| 6,556,437 B1 * | 4/2003 | Hardin | 361/687 |
| 6,556,440 B2 | 4/2003 | Jensen et al. | |
| 6,587,342 B1 | 7/2003 | Hsu | |
| 6,654,242 B2 | 11/2003 | Ogawa | |
| 6,678,157 B1 | 1/2004 | Bestwick | |
| 6,721,180 B2 | 4/2004 | Le et al. | |
| 6,878,874 B2 * | 4/2005 | Osborn et al. | 174/50 |
| 7,256,995 B2 * | 8/2007 | Wrycraft et al. | 361/695 |
| 2003/0039546 A1 | 2/2003 | Lui | |

FOREIGN PATENT DOCUMENTS

| | | |
|---|---|---|
| JP | 2-17846 | 2/1990 |
| JP | 2000-22375 | 1/2000 |
| JP | 2000-64997 | 3/2000 |
| JP | 2001-65926 | 3/2001 |
| JP | 2001-99098 | 4/2001 |

* cited by examiner

F I G. 13
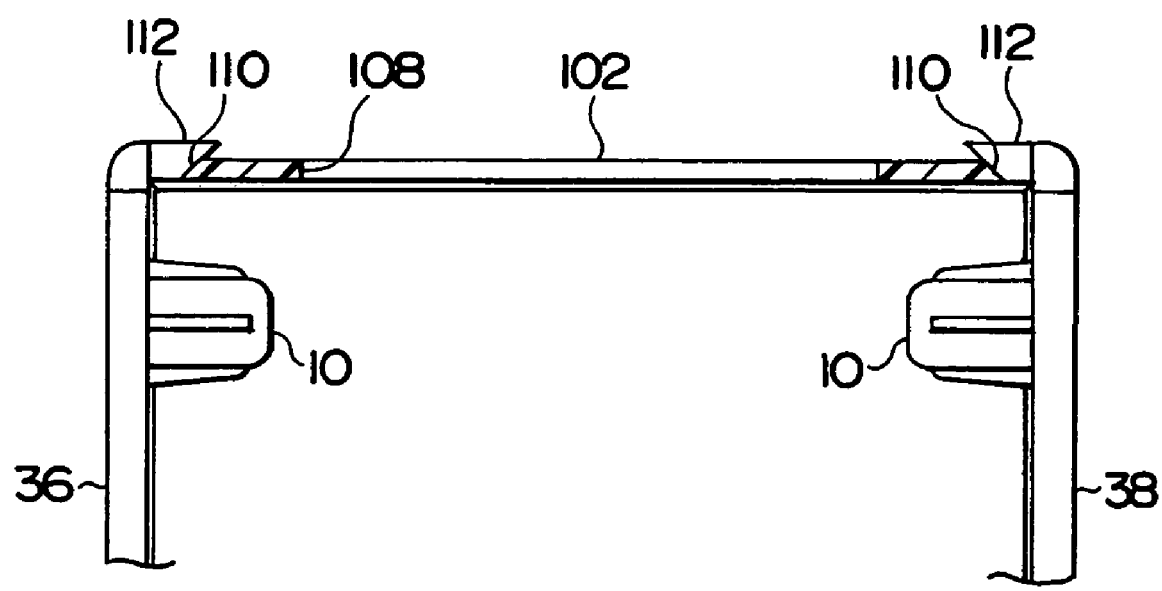

FIG. 18
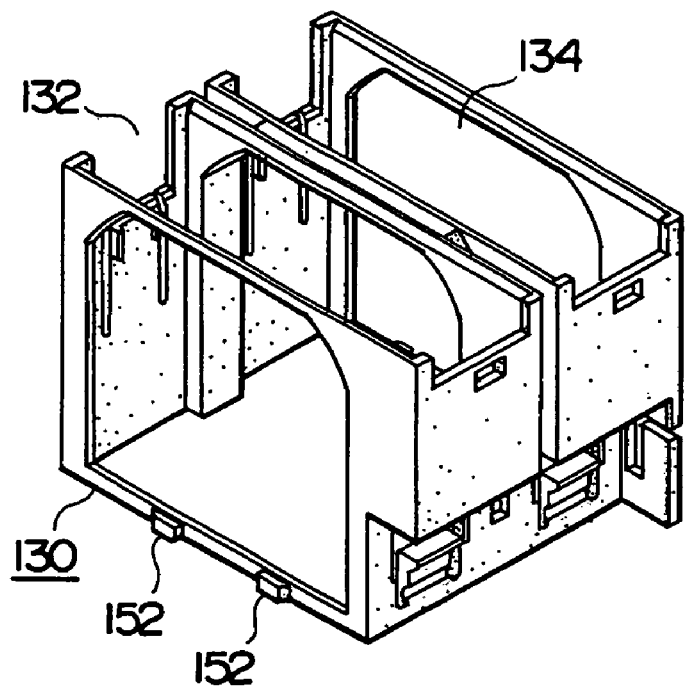
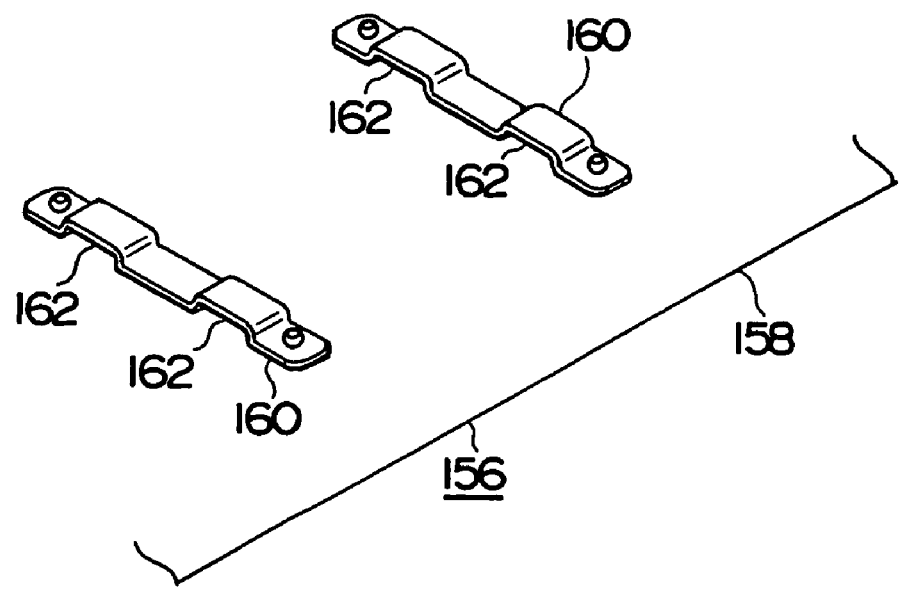

F I G. 25
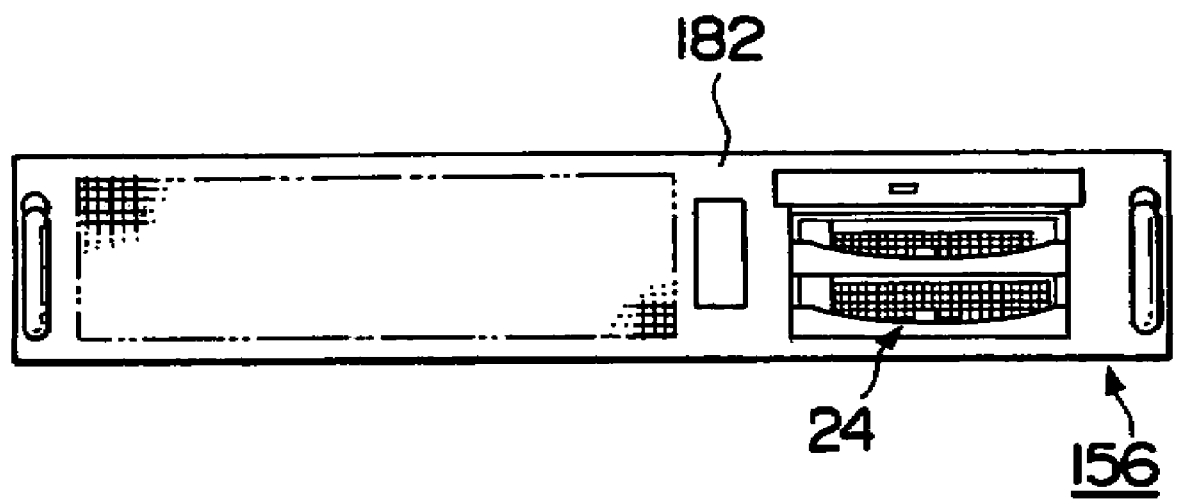

CASING, EQUIPMENT UNIT AND FAN UNITS PROVIDED WITH THE CASING, AND ELECTRONIC EQUIPMENT PROVIDED WITH THE FAN UNITS

CROSS REFERENCE TO RELATED APPLICATION

This application is a Continuation of application Ser. No. 10/740,797 filed Dec. 22, 2003, now U.S. Pat. No. 7,048,498, and claims priority benefit to Japanese Application No. 2003-019431 filed Jan. 28, 2003, the entire contents of both of which are incorporated by reference herein.

BACKGROUND OF THE INVENTION

1. Field of the Invention

The invention relates to a casing having a structure capable of implementing assembling and disassembling and attaching and so forth with ease, and the casing, equipment unit, fan units, and electronic equipment capable of assembling and disassembling without using a tool and so forth.

2. Description of the Related Art

A cooling fan used conventionally in an electronic equipment is attached to an equipment body and an exterior case of an electronic equipment, using fixture parts such as screws, and the assembling and attaching to the electronic equipment require tools such as a driver. A downsized electronic equipment and an electronic equipment having high mounting density in the parts thereof are very troublesome in attaching operation of fan units, and requires time and labor.

There are, for example, JP A 2000-64997 and JP A 2000-22375 as the prior art disclosing an attachment structure or a cooling structure of the cooling fan of the electronic equipment.

JP A 2000-64997 discloses attachment equipment of a cooling fan and a method of attachment of the cooling fan for use in cooling heating parts in the electronic parts of personal computer and other electronic parts, for example, such as an IC, an LSI and an MPU. JP A 2000-22375 discloses a fixture structure of the fan unit in which the replacement of the fan unit is made easily when troubled.

The technique disclosed in JP A 2000-64997 has a structure wherein a cooling fan is disposed on a substrate and an attachment pin is inserted from the frame side of the cooling fan to attach the cooling fan to the substrate. An attachment hole having a diameter, which is larger than the attachment pin is formed on the substrate, wherein the attachment pin has a retaining part on one end thereof, and has a retaining washer on the other hand, which is reduced in diameter when it is inserted into the attachment hole of the substrate and returned to its original diameter after it is inserted into the attachment hole. A coil spring is attached to a part which protrudes on the frame of the attachment pin. With use of such an attachment pin, although it is possible to dispose the cooling fan on the substrate and easily attach the cooling fan on the substrate by inserting the attachment pin from the frame side of the cooling fan, the structure of the attachment pin is complex and the cooling fan is trouble to be removed from the substrate. Further, the fixture strength relies on the elasticity of the coil spring.

Further, the technique disclosed in JP A 2000-64997 has a specific attachment structure in which the cooling fan is directly connected to the heating parts, which structure cannot be generally applied to the electronic equipment.

The technique disclosed in JP A 2000-22375 merely provides a simplified fixture structure having elastic pieces on the fan unit fixing part for fixing the fan units, and the fan units are fixed between the elastic pieces and retaining pieces owing to the elasticity of the elastic pieces, which however not apply the casing to the equipment such as fan units, and so forth.

Meanwhile, when fixing the fixture components such as screws and so forth using tools such as drivers and so forth when attaching the electronic equipment such as cooling fan, the operation influences upon the accuracy and cost of the product.

SUMMARY OF THE INVENTION

It is an object of the invention to provide a casing capable of assembling and disassembling, attaching and so forth with ease. It is another object of the invention to provide an equipment unit, fan units, and an electronic equipment using the casing.

The casing, the equipment unit, the fan units and the electronic equipment of the invention resolved such problems has the following construction.

The casing of the invention, to achieve the above object, has casing sections 36, 38, 40, hinge parts 42, 104 and a coupling part 76. The casing sections are made up of not less than two sections and enclosing a hosing space, and members for securing the housing space thereby. The hinge parts couple the casing sections and support each casing section. That is, not less than two casing sections couple the edge parts of each casing section, and bendably support each casing section. The coupling part is a member for restraining the casing sections positionally and maintaining and fixing the housing space. That is, the coupling parts detachably couple each casing section to hold the housing space by each casing section.

According to the casing having such a structure, not less than two casing sections which are bendably supported by the hinge parts enclose the housing space, and the casing sections enclosing the housing space are detachably coupled and held by the coupling parts. Various electronic equipment such as a fan body and a body of an electronic unit are housed in the housing space. The fixture screw or tools are not necessary for assembling the casing, and the tools are also not necessary for disassembling the casing. With the casing having such a structure, if the casing is formed of a synthetic resin, the hinge part can be formed by a part of the synthetic resin and the bearing and supporting pivot can be structured by the hinge part. Even if either of the hinge parts is employed, not less than two casing sections constitute a linked body using the hinge part, so that the casing having not less than two casing sections is structured as a single part. Accordingly, in the casing having such a structure which is easily assembled and disassembled without using fixture screws or tools, so that the number of steps for assembling and disassembling a finished product can be reduced, thereby contributing to enhancement in productivity.

With the casing having such a structure, the coupling parts comprise a fixture pawl 88 provided on one of the casing sections to be coupled, and a recess provided on another for fixing the fixture pawl 88, whereby the coupling of the casing sections can be easily and quickly implemented, so that the number of steps for assembling and disassembling a finished product can be reduced, thereby contributing to enhancement in productivity.

To achieve the above object, the casing of the invention may be structured that it comprises first and second casing sections corresponding to not less than two faces of equipment body, respectively, and covering the faces, fitting parts for detachably fitting at least one of the first and second casing sections to the equipment body, a third casing section attached between the first and second casing sections through the intermediary of hinge parts bendably holding the respective casing sections, a fixture pawl protruded from the first casing section, in the widthwise direction of the equipment body, and a fixture recess formed in the second casing section, for detachably and securely holding the fixture pawl thereto.

Further, to achieve the above object, the casing of the invention may be structured that it comprises first and second casing sections corresponding to not less than two faces of equipment body enclosed thereby, respectively, and covering the faces, fitting parts for detachably fitting at least one of the first and second casing sections to the equipment body, a third casing section attached between the first and second casing sections through the intermediary of hinge parts bendably holding the respective casing sections, a gap retaining member protruding from the first casing section or the second casing section toward a width direction of the equipment body for holding the space between the first and second casing sections at a fixed interval.

Further, to achieve the above object, in these casings, it may be structured that the casing attains an electromagnetic shielding function, that the casing section has a pull, that the casing is formed of a synthetic resin, that a printed wiring board is held on the opposite parts of the casing sections, that the casing includes a pocket for holding the printed wiring board on the casing, that the casing includes a fixture pawl corresponding to the fixture recess in arms capable of bending, and that the casing includes a pull which is bendable and opposed to the arms.

The equipment unit of the invention is provided with an equipment body, a casing 2 and fitting parts 12. Although equipment body is a body of various electronic equipment such as a fan body or substrate and so forth, it is regardless whether the exterior case is present or not. The casing is installed on the equipment body, enclosing at least two faces of the equipment body. In this case, with the equipment body having no exterior case, this casing serves as an exterior case. The fitting parts are parts for detachably fitting the casing and the equipment body to hold the casing by the equipment body.

With the equipment unit as described above, the casing is detachably installed on the equipment body to be integrated with. Tools are not necessary for assembling and disassembling the casing enclosing the equipment body. Accordingly, according to the equipment unit having such a structure, the attachment and detachment between the equipment body and the casing can be easily implemented without using a fixture screws, tools and so forth so that the steps of assembling and disassembling of the equipment unit are reduced, thereby improving productivity.

To achieve the above object, the equipment unit of the invention may be structured that it comprises an equipment body, not less than two casing sections corresponding to not less than two faces of the equipment body for constituting a casing for covering the faces, fitting parts for fitting at least one casing section of the casing sections and the equipment body, hinge parts for bendably supporting each casing section, and coupling parts for detachablly coupling between the casing sections.

Further, to achieve the above object, in these equipment units, they may be structured that the casing attains an electromagnetic shielding function, that the casing section has a pull, that the casing is formed of a synthetic resin, that a printed wiring board is held on the opposite parts of the casing sections constituting the casing, and that the casing includes a pocket for holding the printed wiring board on the casing, and so forth.

To achieve the above object, the fan unit of the invention is provided with a fan body 4, fitting parts 12, a casing 2, a ventilation part, a guard part. The fan body is provided with, for example, rotating blades and a motor for driving rotating blades. One face of the fan body becomes an intake face and the other face becomes an exhaust face in the direction of the air flow caused by the rotating blades. The casing is installed on the fan body and encloses either or both of an intake face and the exhaust face of the fan body. Fitting parts detachably fit the casing and the fan body to hold the casing on the fan body. Ventilation parts corresponds to the intake and exhaust face of the fan body to ventilate. Further, although the guard part covers the ventilation part of the casing, it separates rotating parts such as rotating blades and so forth of the fan body from an operator to prevent the operator from touching the rotating parts without preventing ventilation.

With the fan unit as described above, the fan body can be detachably integrated with the casing without tools when implementing assembling and disassembling the casing enclosing the equipment body. Accordingly, the fan body and the casing can be easily attached to and detached from each other without using fixture screws, tools and so forth so that the number of steps for assembling and disassembling fan units can be reduced, thereby contributing to enhancement in productivity. Further, since the ventilation part of the casing is provided with the guard part for preventing fingers and so forth from inserting, a conventional finger guard is not necessary and in the case where the guard part is installed in both the casing section opposite to the intake face and the other casing section opposite to the exhaust face, the fan body can be attached to the casing irrespective of the direction of air flow of the fan body.

To achieve the above object, the fan unit of the invention may be structured that it comprises a fan body, not less than two casing sections constituting a casing for covering the faces of the fan body corresponding to not less than two faces of the fan body, a ventilation part formed on at least one casing section of the casing sections, fitting parts for detachably fitting at least one casing section of the casing sections and the fan body, hinge parts for bendably supporting between the casing sections; and coupling parts for detachably coupling between the casing sections.

To achieve the above object, with the fan unit of the invention, it may be structured that it comprises an indicator for indicating an operation of the fan body and a window for checking the indicator in the casing, that the casing attains an electromagnetic shielding function, that the casing section has a pull, that the casing is formed of a synthetic resin, that a printed wiring board is held on the opposite parts of the casing sections constituting the casing, that it includes a pocket for holding the printed wiring board on the casing, and that electromagnetic shielding function can be attained by mixing an electrically conductive material in the synthetic resin to form the casing, and so forth.

To achieve the above object, the electronic equipment of the invention is an electronic equipment 156 provided with an exterior case 157 and it comprises a support member, housing cases 132, 134, an equipment unit, and a fixture pawl 94. The support member is detachably attached to the exterior case of the electronic equipment and the hosing cases are housing spaces formed in the support member, and the equipment unit is detachably housed in the housing case. Further, the fixture pawl is provided in the casing of the equipment unit to be movable back and forth for fixing the equipment unit to the housing case of the support member.

With such an electronic equipment, the support member is detachably attached to the exterior case of the electronic equipment and the equipment unit is housed in the housing case of the support member. At this time, the equipment unit is fixed to and maintained at the support member by the fixture pawl. That is, in this housing state, the equipment unit can be prevented from being moved and come off. Further, when disassembling, the fixture pawl is removed from the support member by moving the fixture pawl back and forth, so that the equipment unit can be taken out from the housing case of the support member. As a result, assembling and disassembling of the electronic equipment can be implemented without using tools and so forth, so that the reduction of the number of the components and attachment of the equipment unit to the electronic equipment can be attained with ease.

Accordingly, with such an electronic equipment, since assembling and disassembling can be implemented without using fixture screws or tools, the equipment unit is attached to, or detached from the exterior case with ease by moving a fixture pawl back and forth, so that fixture components such as fixture screws etc. are not required, the number of parts can be reduced, and also the number of steps for assembling and disassembling the electronic equipment can be reduced, thereby contributing to enhancement in productivity, Further, if a narrow space where a support member is installed can be secured in the exterior case, the equipment unit can be easily attached to, or detached from the housing case, thereby enhancing the freedom of designing the arrangement of the equipment unit inside the exterior case.

Further, to achieve the above object, in this electronic equipment, it may be structured that the casing attains an electromagnetic shielding function, that the casing section has a pull, that the casing is formed of a synthetic resin, that an electrically conductive material is mixed in the synthetic resin to form the casing, thereby attaining the electromagnetic shielding function, that a printed wiring board is held on the opposite parts of the casing sections constituting the casing, and that the casing includes a pocket for holding the printed wiring board on the casing.

Other objects, features and advantages of the invention will be made more clear with reference to the attached drawings and each of the embodiments.

BRIEF DESCRIPTION OF THE DRAWINGS

FIG. 13 is a sectional view showing the fixture structure of a pull;

FIG. 18 is an exploded perspective view showing an attachment structure in the electronic unit according to the embodiment of the invention;

FIG. 25 is a front view of the electronic equipment on which the fan units are mounted.

DETAILED DESCRIPTION OF THE PREFERRED EMBODIMENTS

Figure 1:
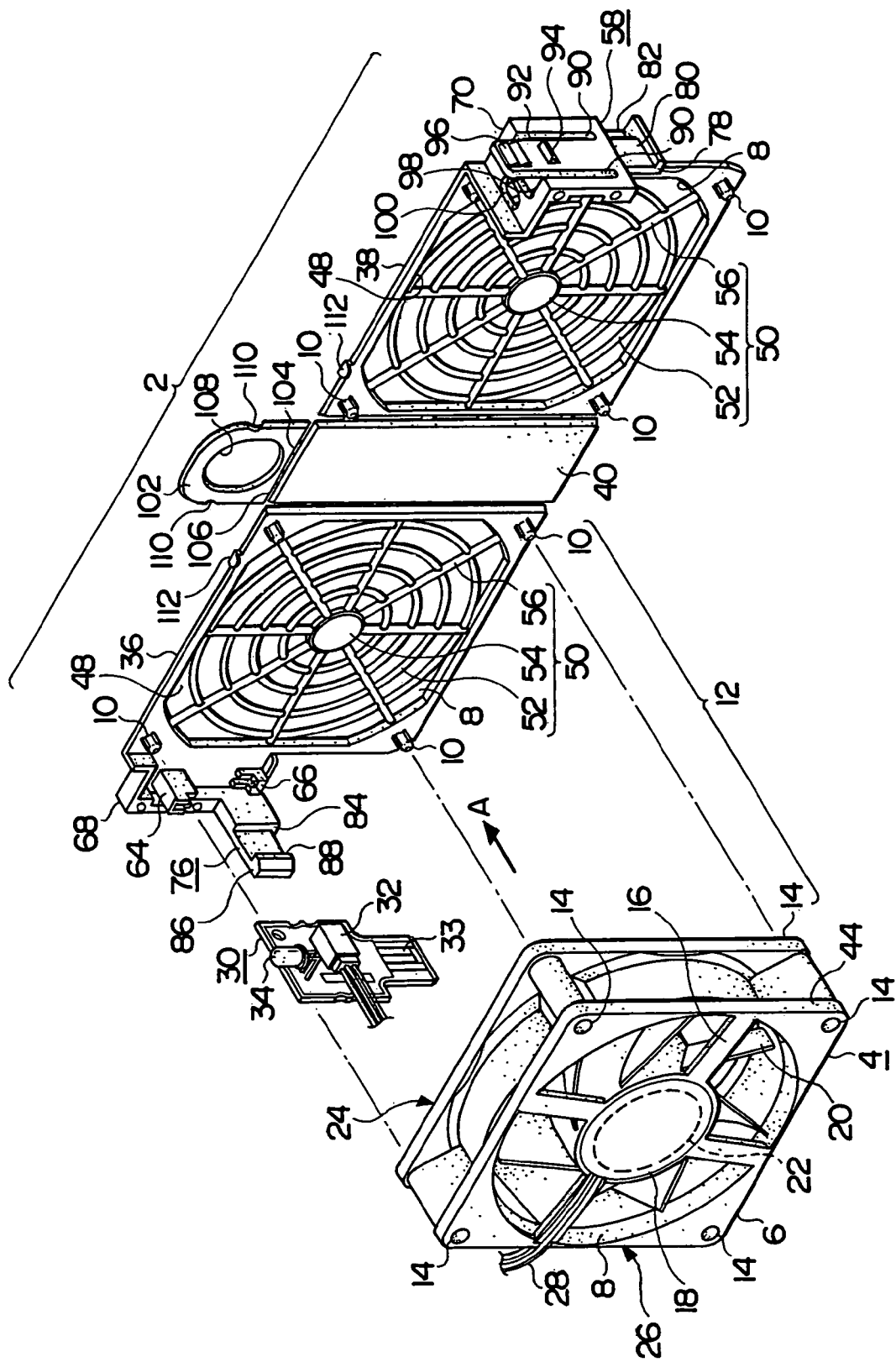
FIG. 1 is a perspective view of the casing, the equipment unit and the fan unit according to the embodiment of the invention, respectively, before assembling.
Figure 2:
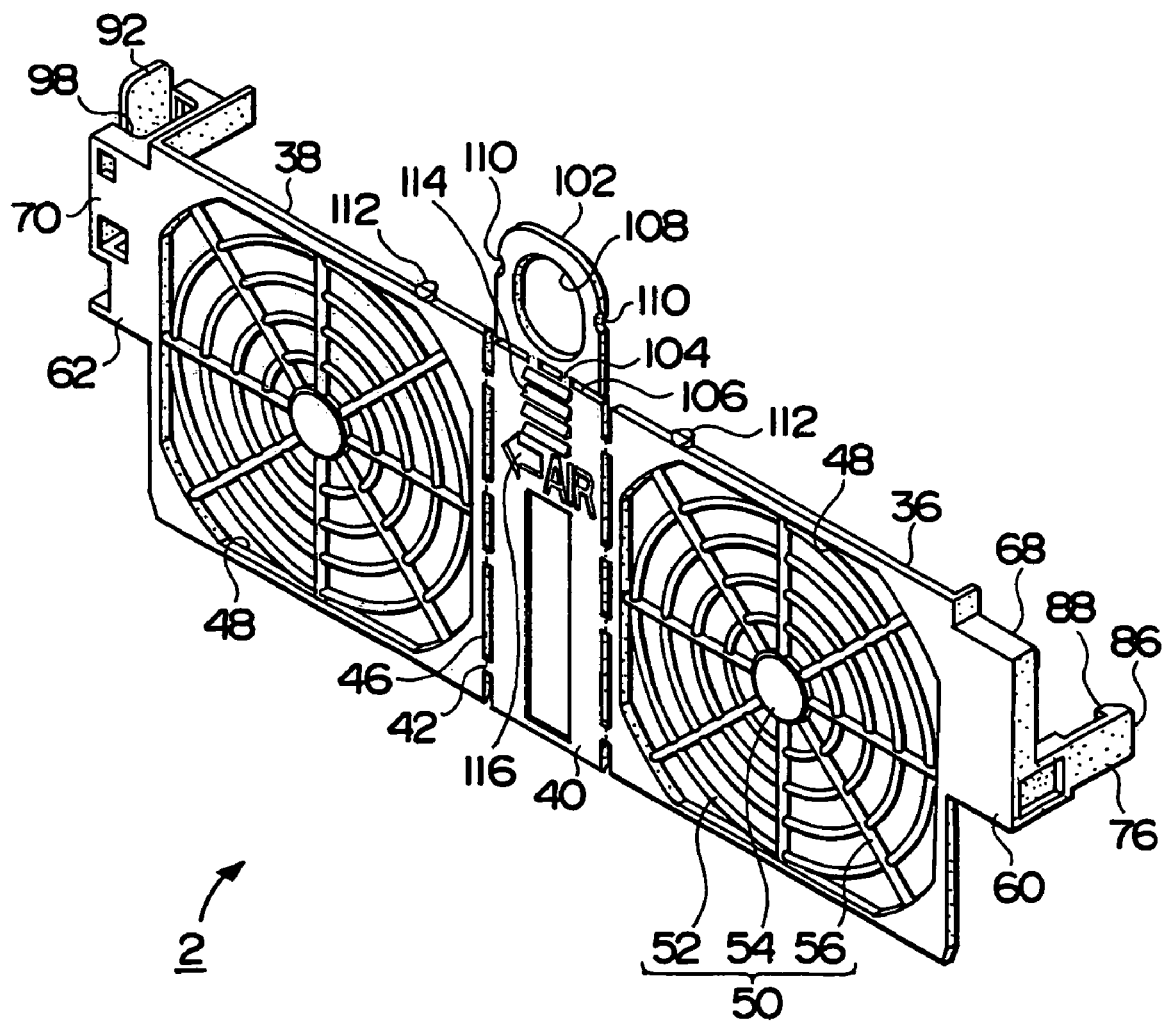
FIG. 2 is a perspective view of the casing before assembling.
Figure 3:
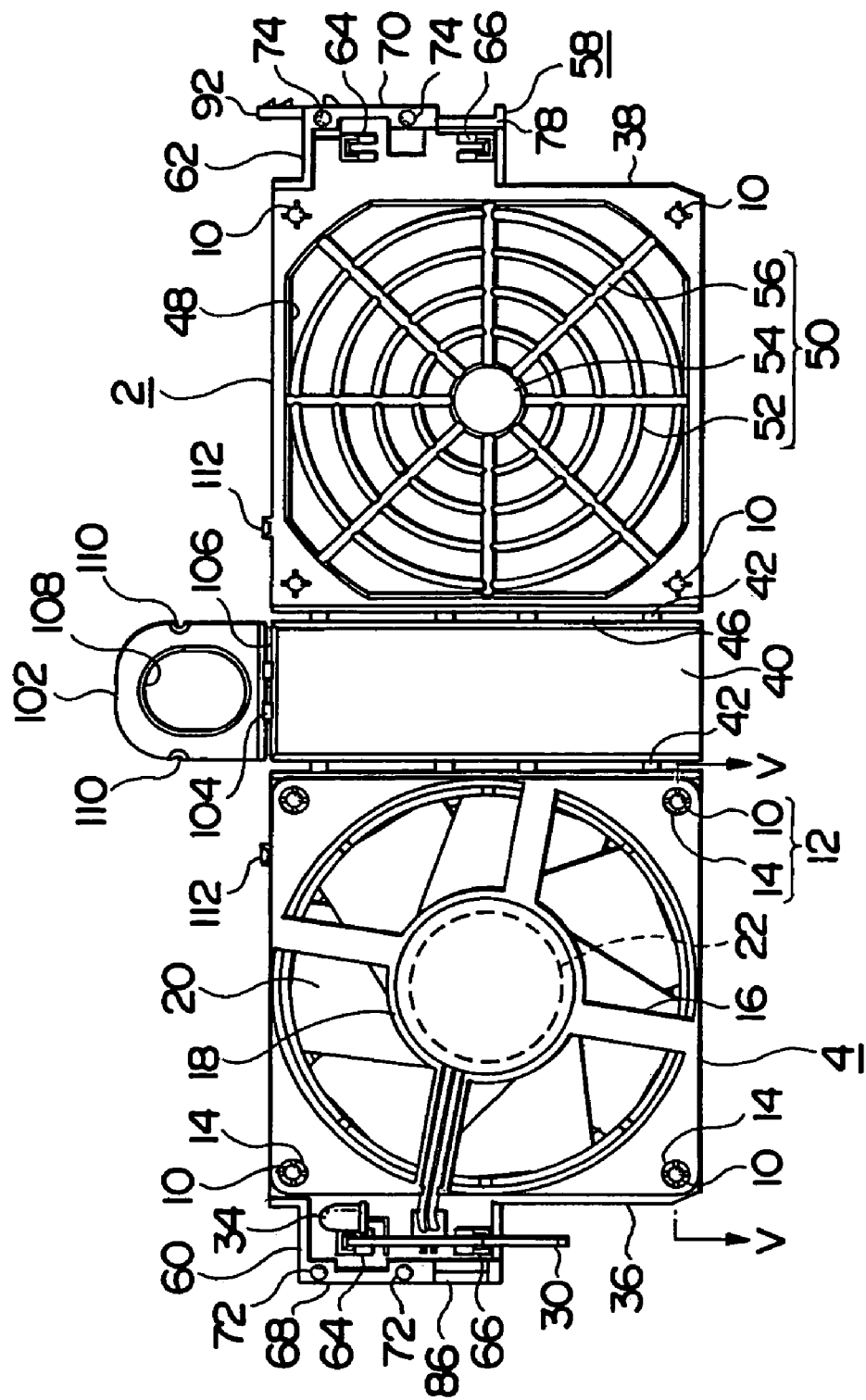
FIG. 3 is a plan view of the casing, the equipment unit and the fan unit, respectively, during assembling.

An embodiment of a casing, and fan unit or an equipment unit, respectively, according to the invention is described hereinafter with reference to FIGS. 1 to 3. FIG. 1 is a perspective view of the embodiment of the casing, and fan unit or the equipment unit, respectively, before assembling, FIG. 2 is a perspective view of the casing before assembling, and FIG. 3 is a plan view of the casing, and fan unit or the equipment unit, respectively, during assembling.

With the present embodiment, for equipment body to which a casing 2 is to be attached, a fan body 4 is used by way of example, however, a body to be packaged to which the casing 2 is to be attached may be electronic equipment other than the fan body 4, or equipment other than the electronic equipment may be used instead. By installing the fan body 4 inside a housing space defined by the casing 2, that is, as a result of integration of the fan body 4 with the casing 2, a fan unit as an example of the equipment unit is made up.

The fan body 4 is formed in the shape of, for example, a flat hexahedron, a vent 8 circular in shape is formed at the center of a body frame 6 of the fan body 4, and a fitting recess 14 constituting each of fitting parts 12, which is detachably fitted to a fitting protrusion 10 at the casing 2 side, is provided in respective corners of the body frame 6, surrounding the vent 8. In the case of the present embodiment, the fitting recess 14 is a through-hole. A hub 18 at the center of the vent 8 is supported by a plurality of support arms 16 protruding form the body frame 6. The body frame 6 is molded of, for example, a synthetic resin, and is formed integrally with the respective support arms 16 and the hub 18. The hub 18 is provided with a fan motor 22 for driving rotating blades 20 inside the vent 8. Intake and exhaust of air is effected so as to correspond to a rotating direction of the rotating blades 20 driven by the fan motor 22. With the present embodiment, cooling air flows from, for example, the side of an intake face 24 toward the side of an exhaust face 26.

Lengths of wire 28, connected to the fan motor 22, are led to outside of the body frame 6 along one of the support arms 16 to be connected with a fan board 30 that is a printed wiring board with a control circuit, sensor circuit, and so forth, mounted thereon, via a connector 32. A drive circuit for feeding the fan motor 22 with a drive current and an indicator 34 for displaying abnormality etc. of motor rotation are mounted on the fan board 30, and a connecting part 33 is formed at the lower end of the fan board 30. The indicator 34 is made up of a light emitting device such as, for example, a light emitting diode, and so forth.

The casing 2, for covering a plurality of faces of the fan body 4, comprises a plurality of casing sections including a first casing section 36, second casing section 38, and third casing section 40, and there are provided a plurality of hinge parts 42 between the first casing section 36 and third casing section 40 as well as between the second casing section 38 and third casing section 40, respectively, in such a way as to bendably support the first casing section 36 and second casing section 38 with the third casing section 40 interposed therebetween, respectively, those casing sections 36, 38, 40 together forming a linked body. With the present embodiment, upon bending of the casing sections 36, 38, 40 along the hinge parts 42, respectively, the first casing section 36, second casing section 38, and third casing section 40 come to correspond to three faces of the fan body 4, respectively, that is, the first casing section 36 is opposed to the intake face 24 of the fan body 4, the second casing section 38 is opposed to the exhaust face 26 thereof, and the third casing section 40 is opposed to a side face 44 thereof. Further, the first, second and third casing sections 36, 38, 40 have an area, respectively, not smaller than equivalent of the three faces of the fan body 4, opposite to the casing sections 36, 38, 40, respectively.

The casing 2 can be integrally molded of, for example, a thermoplastic or thermosetting synthetic resin. In the case of the casing 2 formed as above, while the hinge parts 42 are formed so as to be smaller in wall thickness than the casing sections 36, 38, 40, respectively, the respective hinge parts 42 are provided with slits 46 so as to be freely bendable taking advantage of flexibility of a constituent material thereof, thereby bendably supporting the casing sections 36, 38, 40. For the hinge parts 42, use may be made of a mechanical hinge mechanism made up of a pivot pin and bearing parts.

The casing sections 36, 38 are provided with a vent 48 serving as a ventilation part, respectively, and in the case of the present embodiment, a finger guard 50 providing a guard to serve as a protective wall for prevention of fingers and so forth from coming in contact with the rotating blades 20 is installed in the vent 48. In this case, the finger guard 50 is made up of a plurality of rings 52 concentrically arranged at appropriate intervals for blocking the fingers and so forth from being inserted into the vent 48, a hub 54 installed at the center of the vent 48, and a plurality of ribs 56 formed radially from the hub 54. Further, the finger guard 50 is formed integrally with casing sections 36, 38, respectively.

A plurality of the fitting juts 10 corresponding to the fitting recesses 14 of the fan body 4, respectively, are formed on the inner face of the casing sections 36, 38, respectively, and the fan body 4 is united with the casing sections 36, 38, respectively, by fitting each of the fitting juts 10 into the respective fitting recesses 14.

A pocket 58, for not only retaining the fan board 30 at a position protruded from the intake face 24 as well as the exhaust face 26 of the fan body 4 but also protecting the fan board 30, is formed for the casing sections 36, 38 and a width of the pocket 58 is set so as to be identical to that of the casing section 40.

As shown in FIG. 2, the pocket 58 has protrusions 60, 62, formed by extending respective edges of the casing sections 36, 38, and as shown in FIGS. 1 and 3, retainers 64, 66 for clamping the fan board 30 therebetween and retaining the same are formed on the respective inner faces of the protrusions 60, 62. The respective retainers 64, 66 have a groove formed in such a way as to correspond to a thickness of the fan board 30 to enable the fan board 30 to be clamped therebetween.

Further, vertical walls 68, 70, each serving as a gap-retaining member, extended in the direction opposite from the respective faces of the casing sections 36, 38, are formed at the respective edges of the protrusions 60, 62 in order to hold the casing sections 36, 38 in parallel with each other while protecting the fan board 30. In the case of the present embodiment, the vertical wall 68 differ in width from the vertical wall 70, and the vertical wall 70 is formed so as to have a larger width, however, it is set such that a width of space formed between the vertical walls 68, 70 when butted against each other is identical to the width of casing section 40. Accordingly, when the vertical walls 68, 70 are butted against each other, the casing sections 36, 38 are kept in parallel with each other. Furthermore, one or a plurality of juts 72 and recesses 74 are formed on the butting surfaces of the vertical walls 68, 70, respectively, and misalignment or mis-joining between the vertical walls 68, 70 can be prevented by engagement of the juts 72 with the recesses 74, respectively.

The pocket 58 is provided with a coupling part 76 for implementing detachable coupling between the casing section 36 and the casing section 38. More specifically, on the vertical wall 70 side, a butting part 78, a groove 80, and a fixture recess 82 are formed while on the vertical wall 68 side, a butting part 84 corresponding to the butting part 78, and a protrusion 86 to be inserted into the groove 80 are formed, and the protrusion 86 is provided with a fixture pawl 88 formed so as to be detachably secured to the fixture recess 82. The casing sections 36, 38 are fixedly held together with the fixture recess 82 and the fixture pawl 88 on the edges thereof.

A pair of slits 90, parallel with each other at a predetermined interval, is formed on the side of the vertical wall 70, and an arm 92 bendable in the widthwise direction of the casing section 38 is formed between the slits 90 while a fixture pawl 94 and protrusions 96 as slip-stoppers are formed on the outer face of the arm 92. A cutout 98 providing room for bending of the arm 92 as well as a window 100 for checking the indicator 34 of the fan board 30 housed in the pocket 58 is formed in a part of the vertical wall 70, on the rear face of the arm 92.

The casing section 40, opposite from the arm 92, is provided with a pull 102 for use in attaching and detaching operation of the casing 2. The pull 102 is bendably formed on the upper edge of the casing section 40 through the intermediary of a hinge part 104. The hinge part 104 is formed smaller in wall thickness than the pull 102 and casing section 40, and in addition, a slit 106 is formed within the hinge part 104, so that the hinge part 104 is rendered bendable owing to flexibility of the constituent material thereof. For the hinge part 104, use may be made of a mechanical hinge mechanism made up of a pivot pin and bearing part. A through-hole 108 capable of allowing a finger to be inserted therein is formed in the pull 102, and on both edges of the pull 102, a pair of retaining recesses 110 each having a conical surface is formed. A pair of pawls 112, corresponding to the retaining recesses 110, respectively, is formed on the respective upper edges of the casing sections 36, 38.

Further, as shown in FIG. 2, a corrugated part 114 for slip-stopping is formed in the upper part of the outer face of the casing section 40 while a notation 116 showing the direction of air flow is provided in the lower part thereof.

Figure 4A:
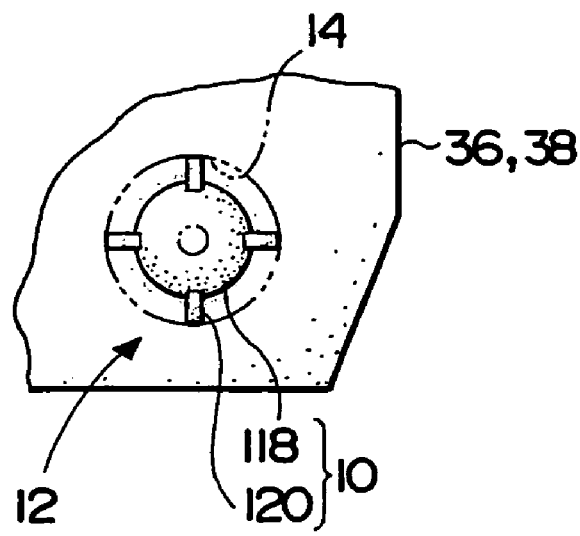
FIG. 4A is a plan view showing an embodiment of fitting parts.
Figure 4B:
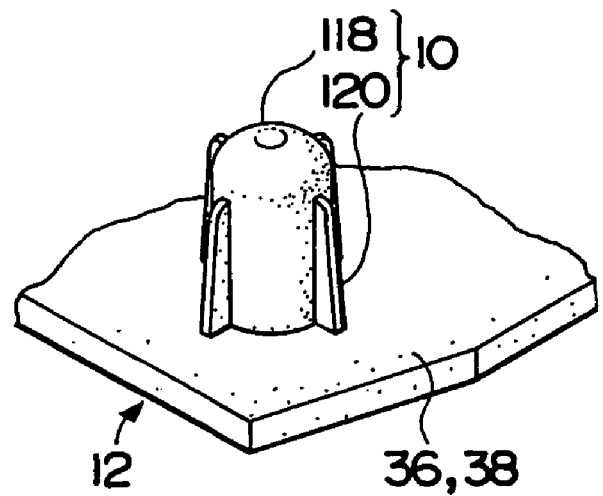
FIG. 4B is a perspective view showing an embodiment of the fitting parts.

As for the respective fitting parts 12 where the casing sections 36, 38 of the casing 2 are fitted to the fan body 4, respectively, the fitting protrusion 10 that can be fitted into the respective fitting recesses 14 is formed as shown in FIGS. 4A and 4B by way of example. FIG. 4A is a plan view of the respective fitting parts 12 and FIG. 4B is a perspective view thereof.

The fitting protrusion 10 is a pillar 118 in a cylindrical shape with the vertex thereof in a hemispherical shape, formed so as to be protruded from the respective inner faces of the casing sections 36, 38, and a plurality of stopper pieces 120 each having a tilted edge are radially formed on the peripheral surface of the pillar 118 so as to extend from the intermediate part thereof toward the base thereof, thereby allowing the respective tilted edges of the stopper pieces 120 to be detachably fitted to the inner wall of the respective fitting recesses 14 of the fan body 4 owing to flexibility of the synthetic resin of which the stopper pieces 120 are made of.

With the present embodiment, while the fitting protrusion 10 is formed of the synthetic resin so as to be integral with the casing sections 36, 38, the pillar 118 may be, for example, in the shape of a square cylinder or an oval cylinder instead of providing the stopper pieces 120. Further, while four pieces of the stopper pieces 120 are formed at angular intervals of 90° on the peripheral surface of the pillar 118 in the case of the present embodiment, three pieces of the stopper pieces 120 may be formed at angular intervals of 120°, or five pieces thereof or more may be formed.

Figure 5:
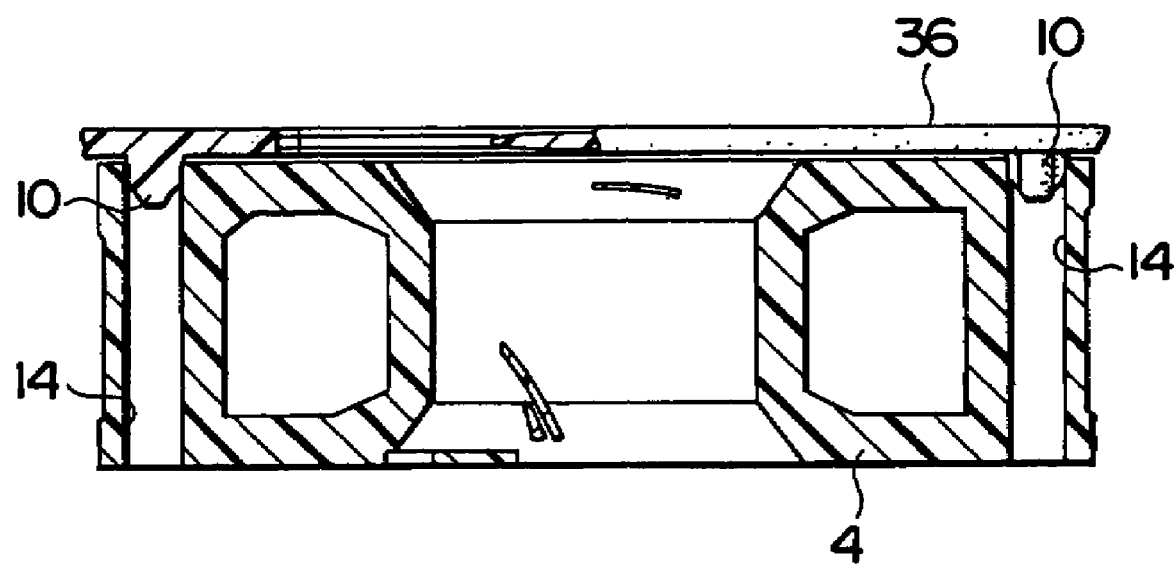
FIG. 5 is a sectional view showing the fitting state between the casing and the fan body.

Now, referring back to the casing 2 and fan body 4, previously described, upon bringing the respective fitting recess 14 of the fan body 4 in line with the respective fitting protrusions 10 of the casing section 36, as shown by the arrow A shown in FIG. 1, and fitting the respective fitting protrusions 10 into the respective fitting recess 14 while concurrently causing the retainers 64, 66 of the casing section 36 to retain the fan board 30, the casing section 36 can be united with the fan body 4 and fan board 30 as shown in FIG. 3. As shown in FIG. 5, the respective fitting protrusions 10 are fitted into the respective fitting recess 14 of the fan body 4, thereby uniting the casing section 36 with the fan body 4. In FIG. 3, the fan body 4 and fan board 30 are attached to the casing section 36, however, for example, the fan body 4 and fan board 30 may be attached to the casing section 38 as shown in FIG. 6.

Figure 6:
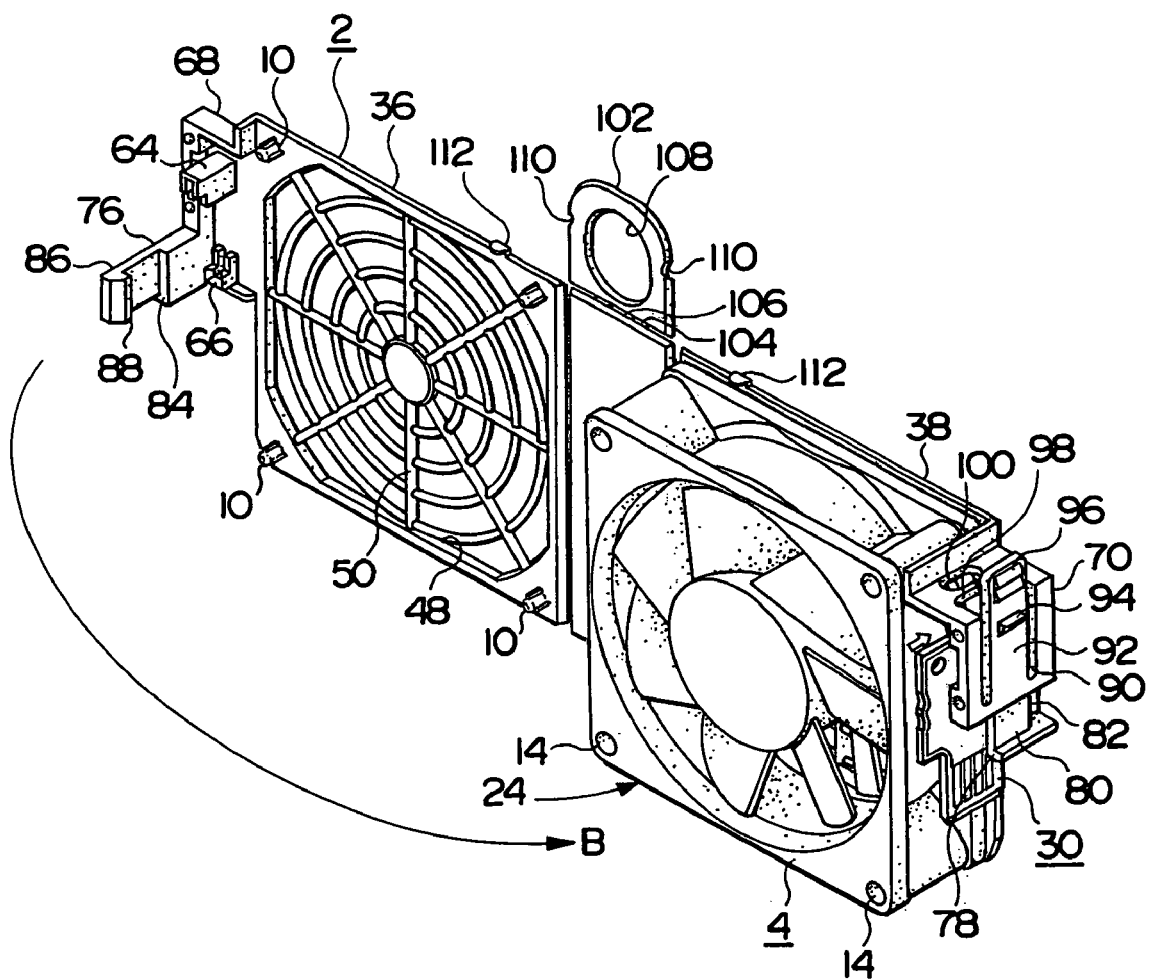
FIG. 6 is a perspective view showing the assembly of the equipment unit and the fan unit.
Figure 7:
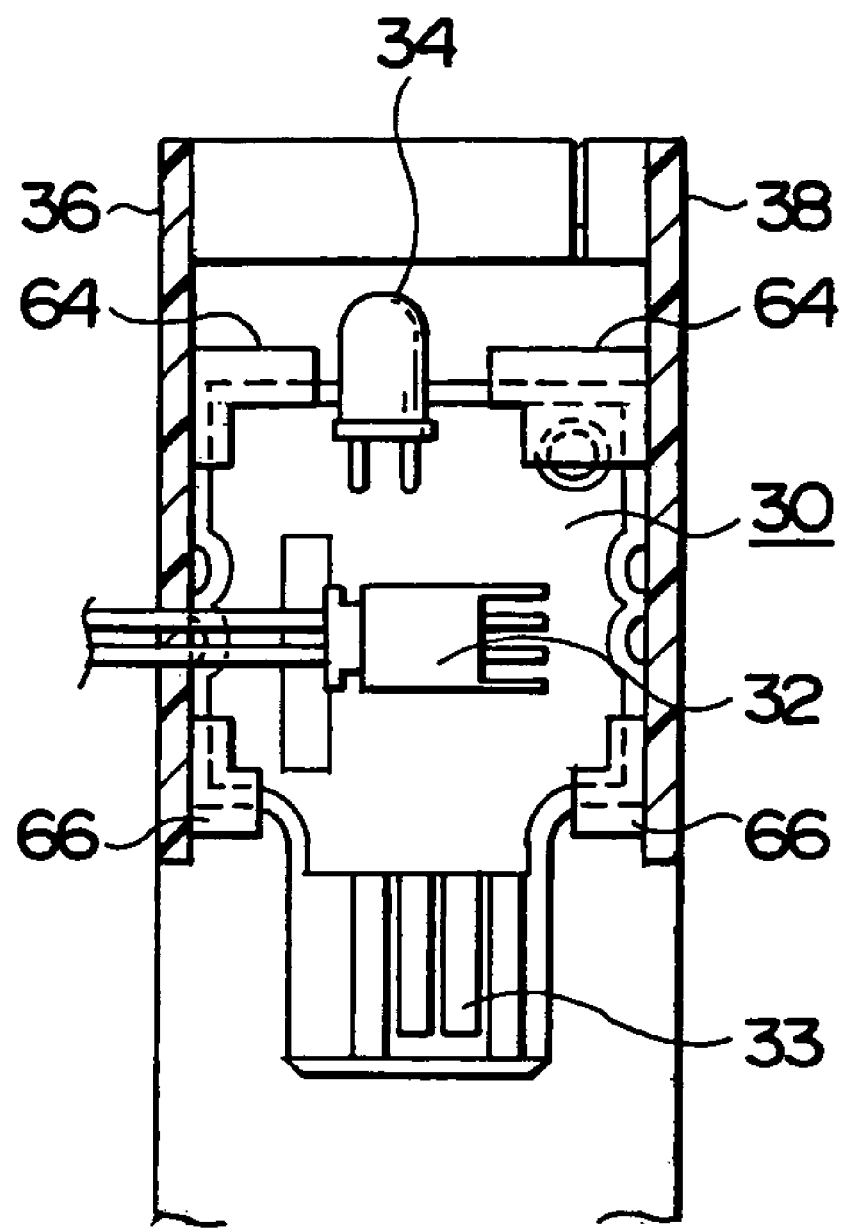
FIG. 7 is a sectional view showing the holding structure of a fan board.
Figure 8:
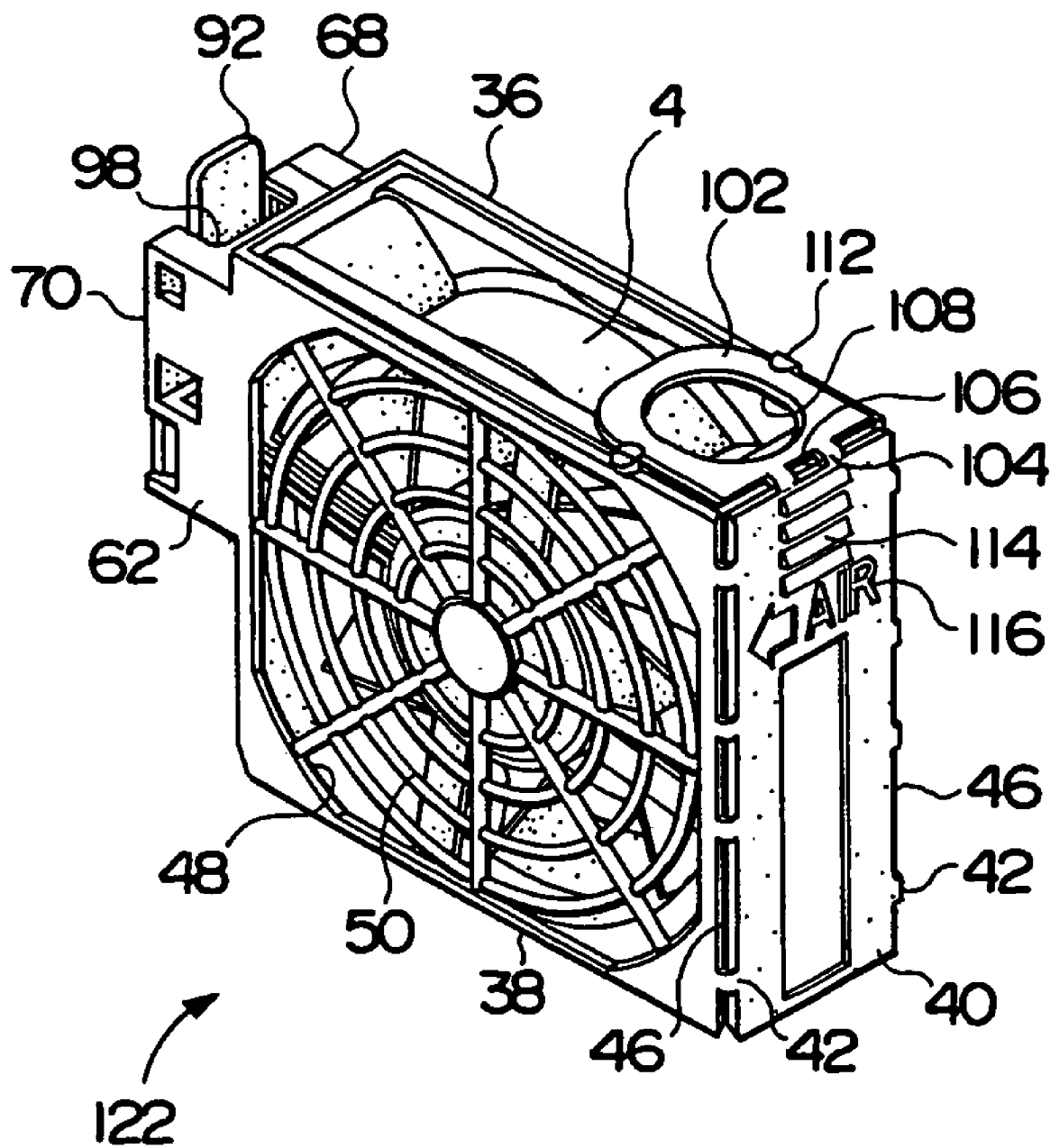
FIG. 8 is a perspective view showing the assembled fan unit.

Thereafter, in a state where the fan body 4 and fan board 30 are attached to the casing section 38 as shown in FIG. 6, the casing section 36 is first bent in a direction indicated by the arrow B, followed by bending of the casing section 40 and casing section 38, in sequence, along the respective hinge parts 42. In this case, the casing section 40 is first brought in contact with the side face 44 of the fan body 4, the casing section 36 is then brought in contact with the intake face 24 of the fan body 4 with the casing section 40 kept in a state described, and the fan board 30 on the casing section 38 side is aligned with the retainers 64, 66 of the casing section 36 to be thereby inserted therebetween while the protrusion 86 is inserted into the groove 80 of the casing section 38, and with such a state being maintained, the fixture pawl 88 of the coupling part 76 is fixedly attached to the fixture recess 82 of the casing section 38. Because the butting part 78 is butted against the butting part 84 at this point in time, excessive movement of the casing sections 36, 38, respectively, is blocked. Further, the fan board 30 is inserted between the respective retainers 64, 66 of the casing sections 36, 38 to be thereby retained as shown in FIG. 7 by way of example, and the fan board 30 as well as the fan body 4 is fixedly attached to the casing 2.

Figure 14:
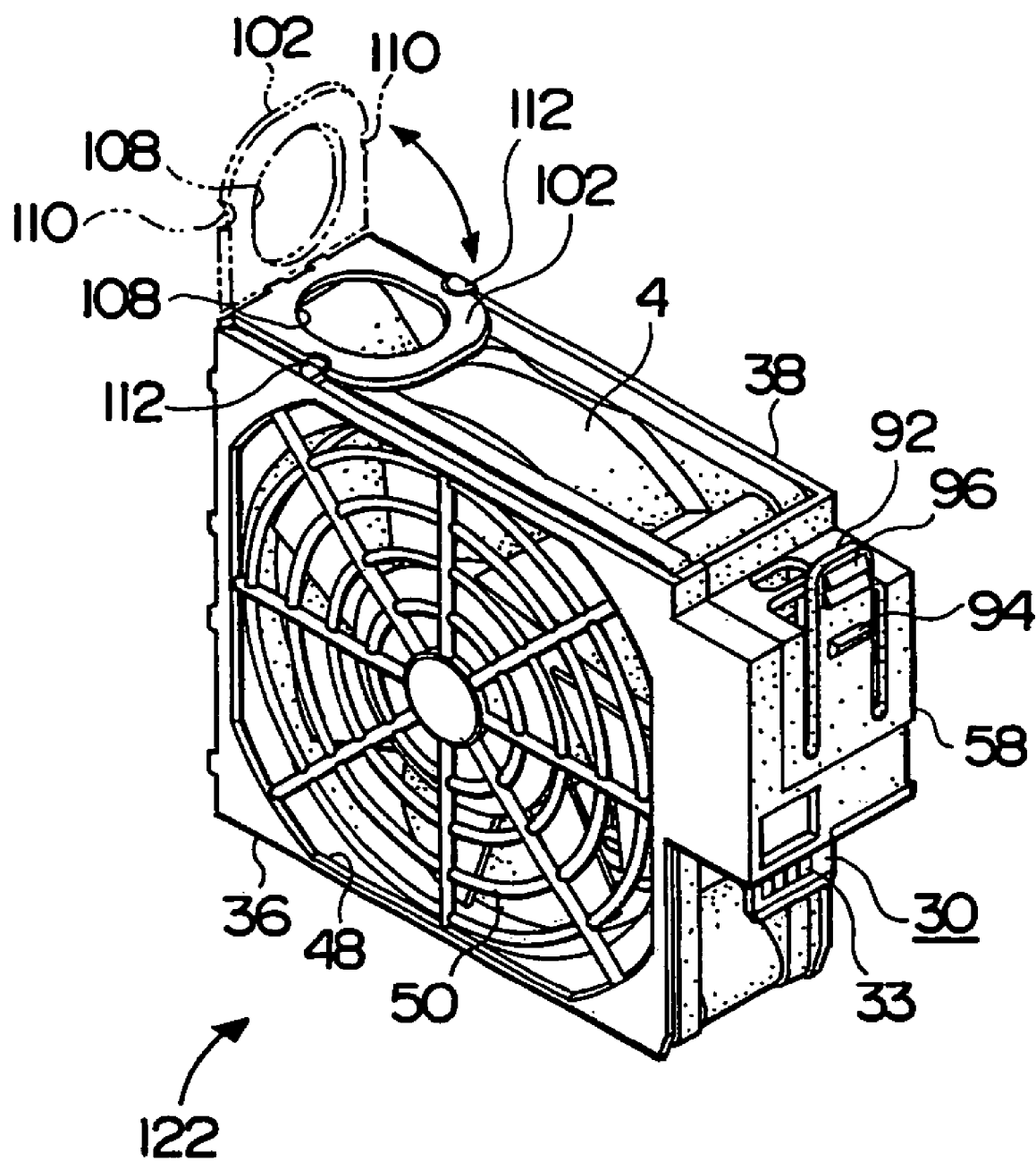
FIG. 14 is a perspective view showing the operation of the pull.

Further, the pull 102 of the casing section 40 is bent toward the top face side of the fan body 4 along the hinge part 104, and the respective pawls 112 of the casing sections 36, 38 are inserted into the respective retaining recesses 110 of the pull 102 to be thereby retained, thus completing the fan unit 122 made up of the casing 2 and the fan body 4 as shown in FIGS. 8 to 12. As for the respective retaining recesses 110 of the pull 102 and the respective pawls 112 of the casing sections 36, 38, the respective pawls 112 are placed so as to overlie the respective retaining recesses 110 to be thereby detachably engaged with each other as shown in FIGS. 13 and 14 by way of example.

Figure 9:
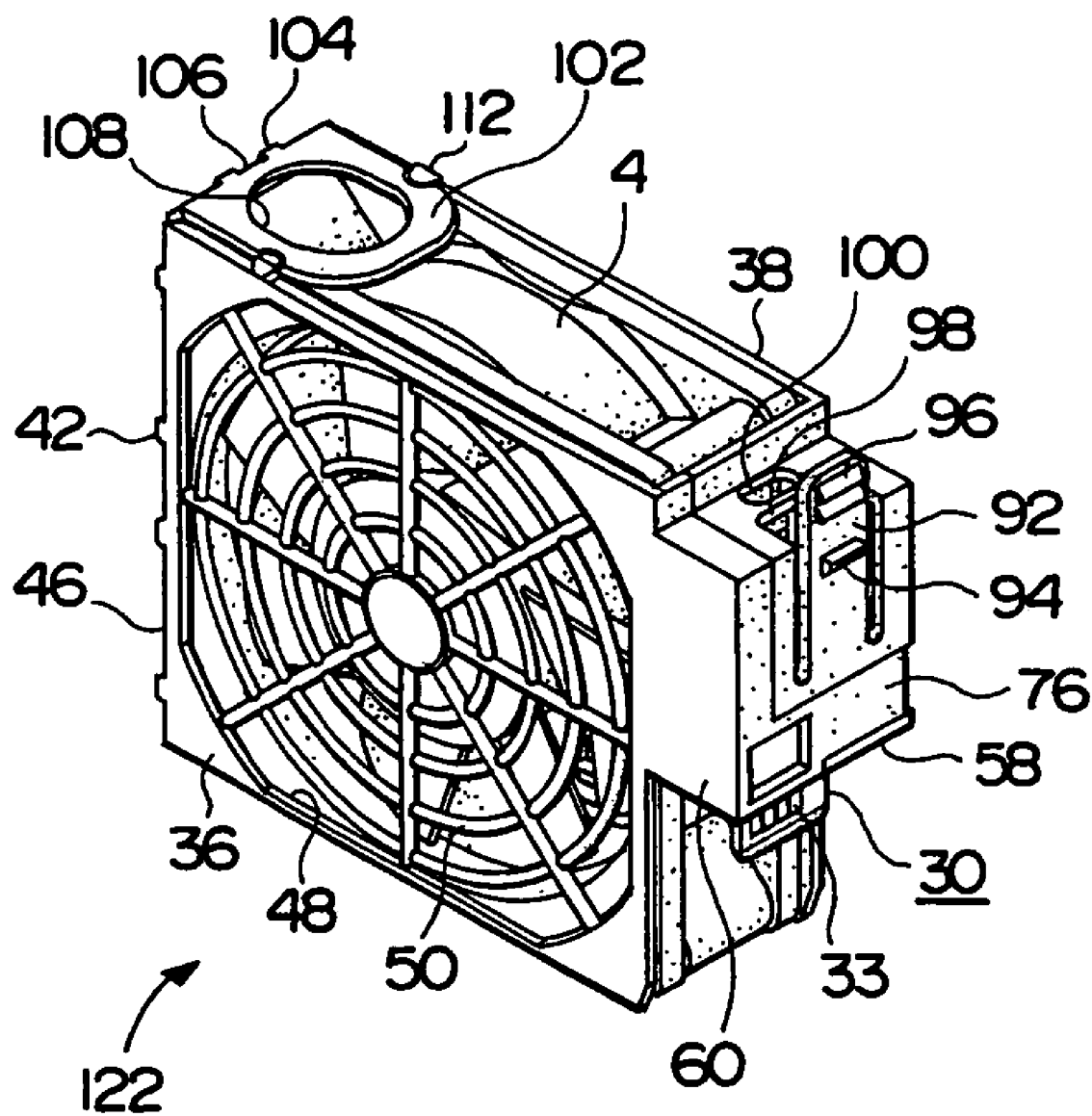
FIG. 9 is a perspective view showing the assembled fan unit.
Figure 10A:
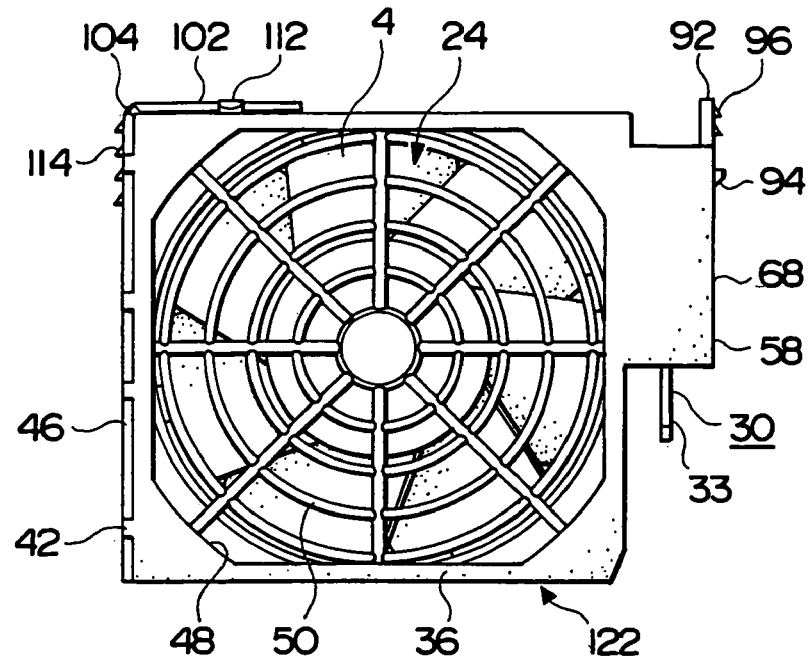
FIG. 10A shows the fan unit in a front view.
Figure 10B:
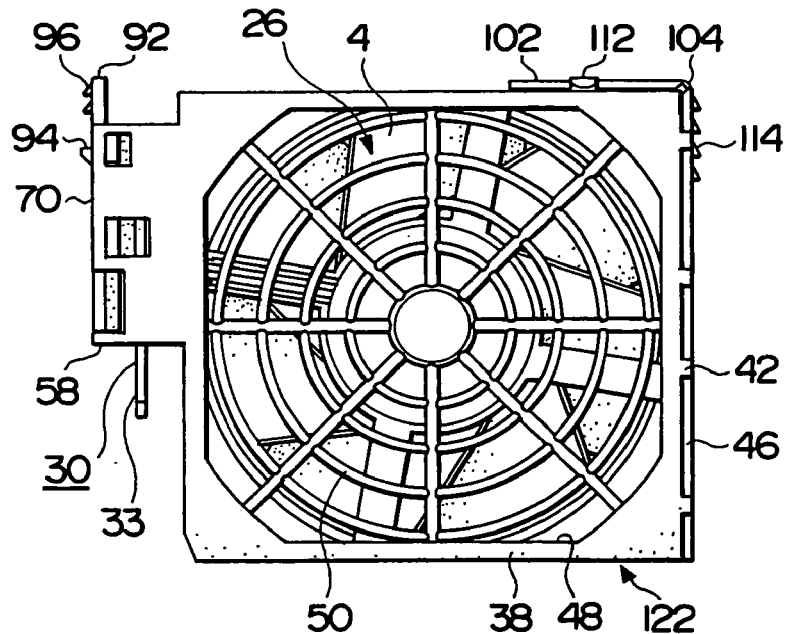
FIG. 10B shows the fan unit in a rear view.
Figure 11A:
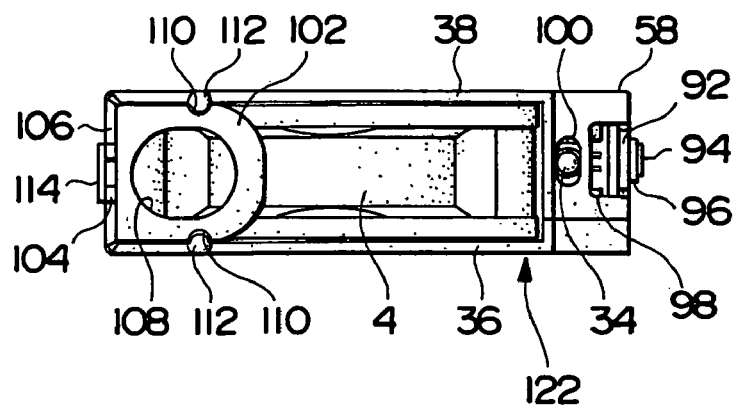
FIG. 11A shows the fan unit in a plan view.
Figure 11B:
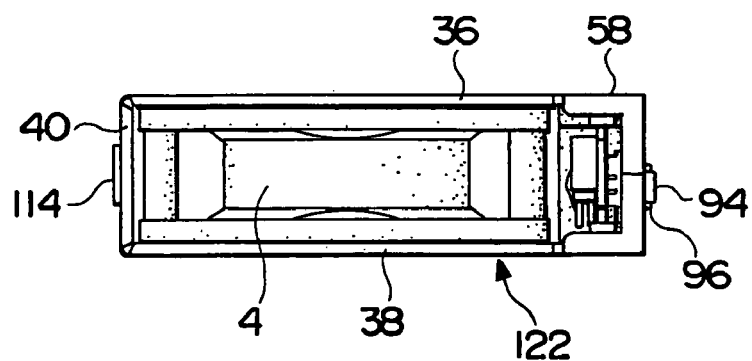
FIG. 11B shows the fan unit in a bottom view.

As shown in FIGS. 8 through 12, with the fan unit 122, the casing section 36 is installed opposite to the intake face 24 of the fan body 4, the casing section 38 opposite to the exhaust face 26 of the fan body 4, and the casing section 40 opposite to the side face 44 of the fan body 4 while the pull 102 is retained by the casing sections 36, 38, and is installed on the top surface of the fan body 4. Further, as shown in FIGS. 9, 10, and 12B, the connecting part 33 of the fan board 30 is exposed in a lower part of the pocket 58 so as to enable connection thereof with an external circuit.

Figure 15:
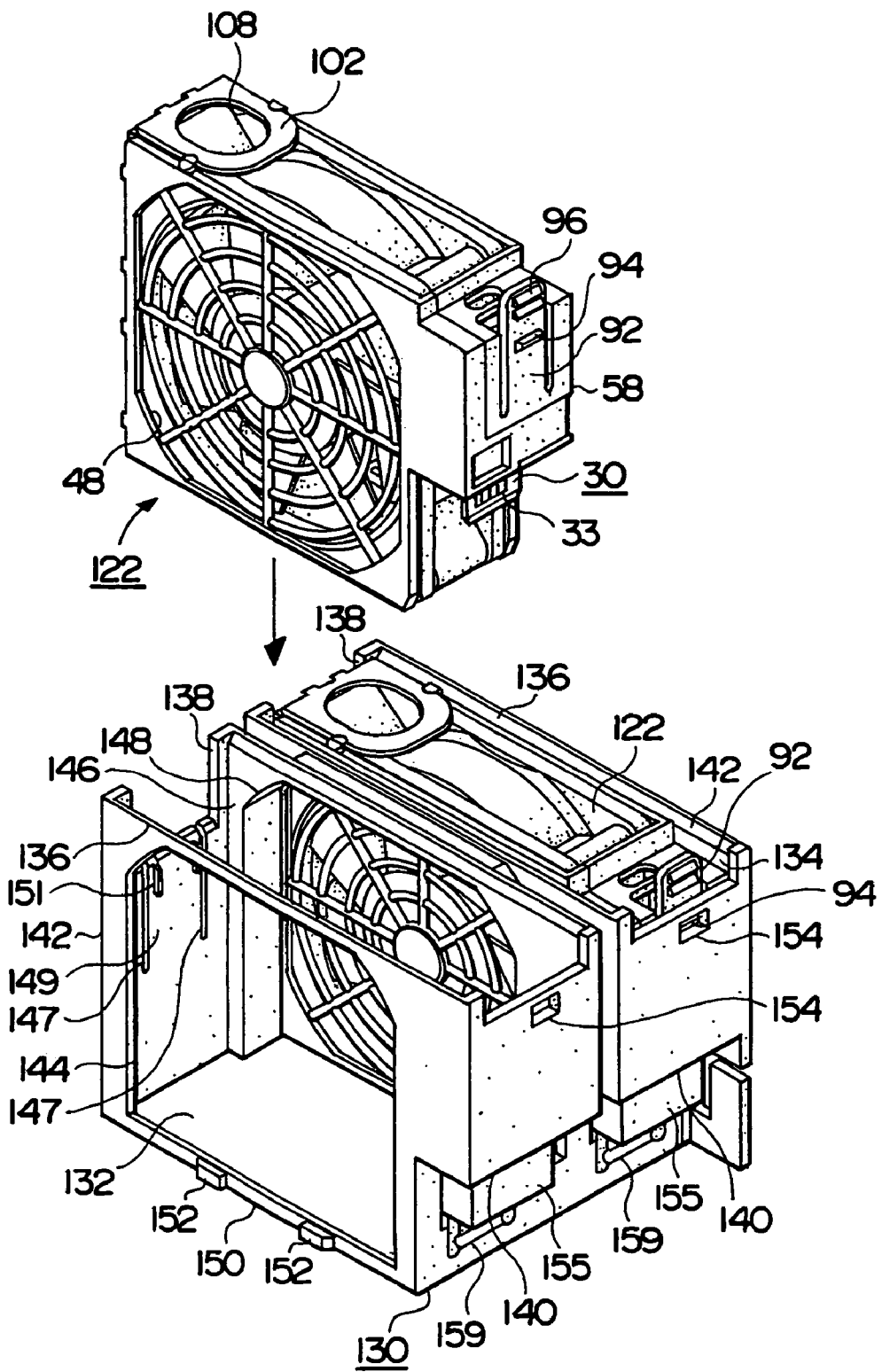
FIG. 15 is a perspective view showing the fan unit to be enclosed in the support frame.
Figure 16:
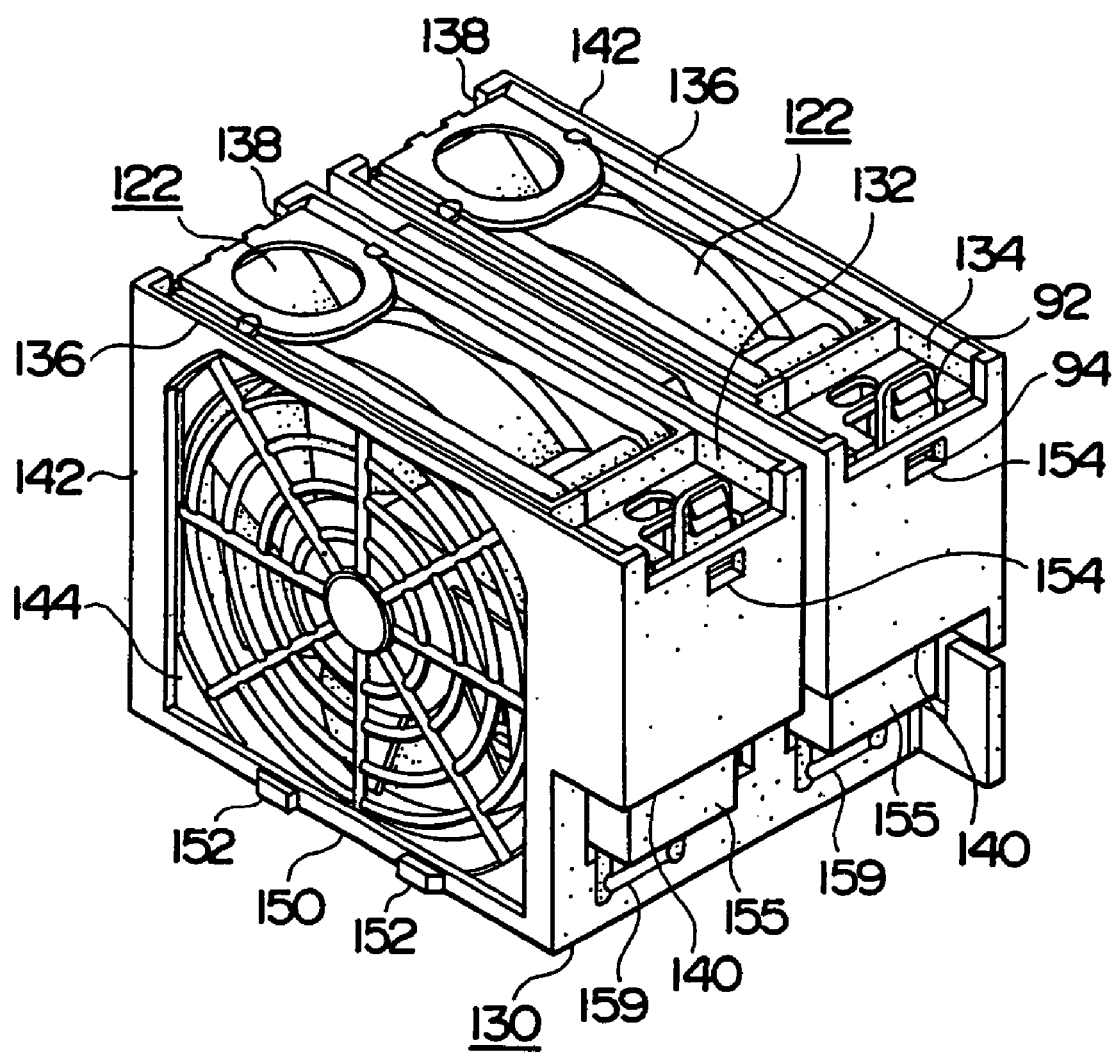
FIG. 16 is a perspective view showing the support frame enclosing the fan units.
Figure 17:
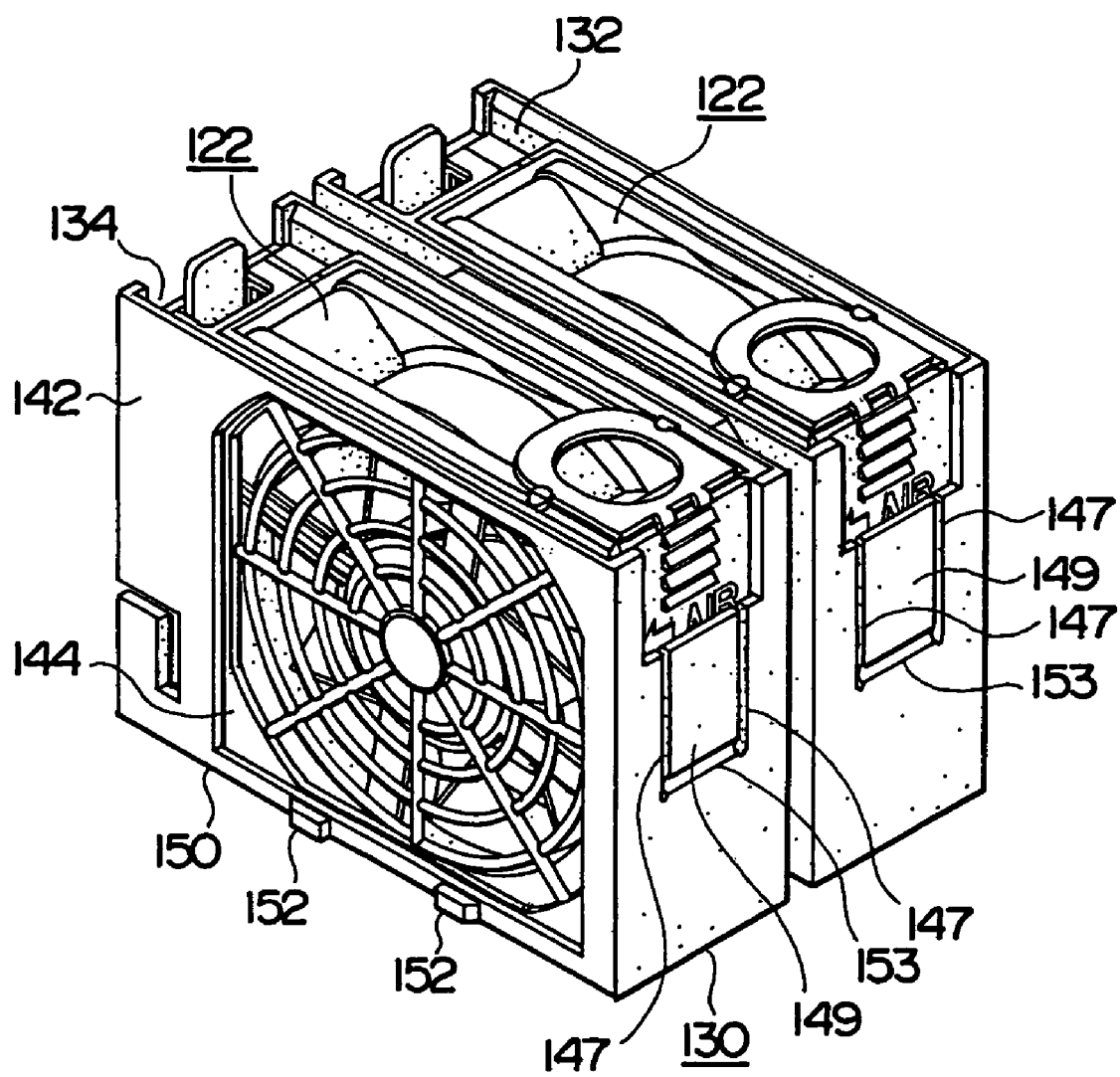
FIG. 17 is a perspective view showing the support frame enclosing the fan units.
Figure 19:
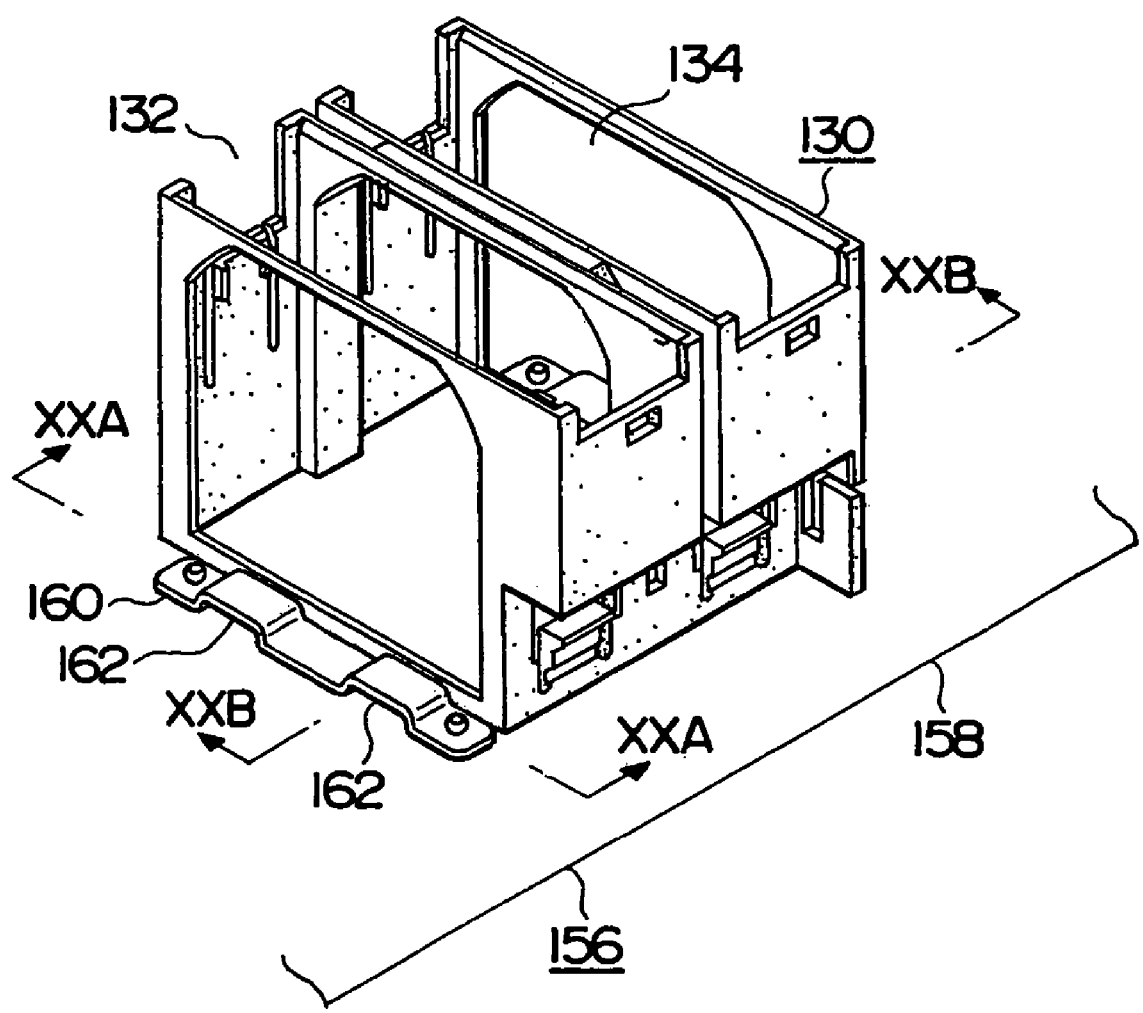
FIG. 19 is a perspective view showing of the attachment structure of the support frame in the electronic unit.
Figure 20A:
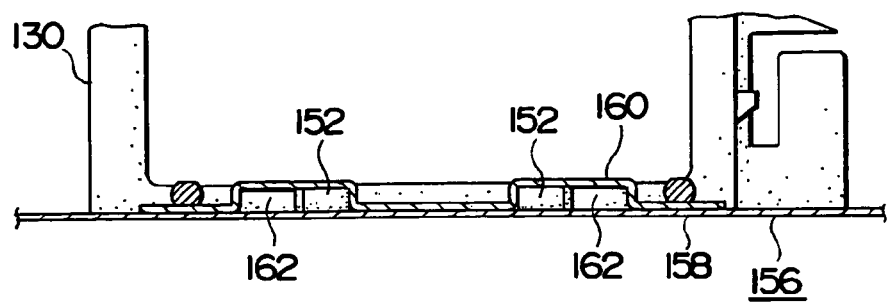
FIG. 20A shows the attachment structure of the support frame installed on an electronic equipment, and sectional view taken along the line XXA-XXA in FIG. 19.
Figure 20B:
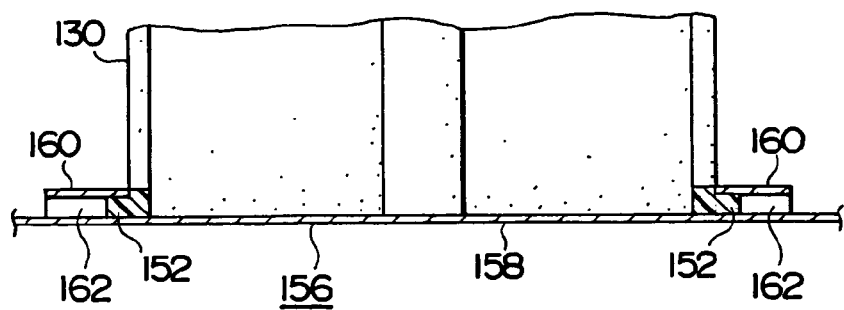
FIG. 20B shows the attachment structure of the support frame installed on the electronic equipment, and sectional view taken along the line XXB-XXB in FIG. 19.

Now, an attachment structure of the fan unit and a support frame thereof is described hereinafter with reference to FIGS. 15 through 20. FIG. 15 is a perspective view showing the fan unit and the support frame thereof. FIGS. 16 and 17 are perspective views showing the support frame enclosing the fan units, respectively, FIGS. 18 and 19 are perspective views showing an example of a fixture structure of the support frame, respectively, and FIGS. 20A, 20B are sectional views showing fixture parts of the fixture structure, respectively.

With the present embodiment, for a support member supporting, for example, the fan units 122 as equipment unit, use is made of a support frame 130 for supporting two sets of the fan units 122. The support frame 130 is provided with two housing cases 132, 134, formed so as to individually house the fan units 122 therein, and on the top side of the housing cases 132, 134, respectively, an insertion inlet 136, a window 138 for allowing the top side of the casing section 40 of the casing 2 to be exposed, and an exterior pocket 140 as an exterior covering member for housing the pocket 58 of the casing 2 are formed integrally with the support frame 130. Further, a ventilating opening 144 corresponding to the vent 48 of the casing 2 is formed in an outer wall 142 of the respective housing cases 132, 134, and a ventilating opening 148 is also formed in a partition wall 146 between the housing cases 132, 134. The bottom of the support frame 130 is open, and a plurality of fixture juts 152 are formed at an edge 150 of an opening of the housing cases 132, 134, respectively.

Further, a fixture recess 154 is formed in the respective exterior pockets 140, and the respective fixture recesses 154 can be brought into engagement with the fixture pawl 94 formed on the outer face of the arm 92 provided in the pocket 58 of the respective fan units 122 by detachably inserting the fixture pawl 94 into the respective fixture recesses 154. In order to ensure the engagement, a pair of slits 147 are provided on a side face of the respective housing cases 132, 134 of the support frame 130, opposite from the respective exterior pockets 140, and a retainer piece 149 is bendably installed between the pair of slits 147. On the inner face of the retainer piece 149, a protrusion 151 butting against a side face of the fan unit 122 is formed while a groove 153 as a thin-thickness portion for enhancing bending characteristics is formed in the base edge of the outer face of the retainer piece 149. Because a distance between the protrusion 151 of the retainer piece 149 and the exterior pocket 140 is set so as to be slightly narrower than a width of the fan unit 122, the fan unit 122 inserted in the respective housing cases 132, 134 is butted against the protrusion 151 of the retainer piece 149 and is subjected to a pushing pressure toward the exterior pocket 140 by the agency of elasticity of the retainer piece 149. Due to the pushing pressure and the engagement of the fixture pawl 94 with the respective fixture recesses 154, the fan unit 122 can be attached to, or detached from the respective housing cases 132, 134 of the support frame 130, and as shown inn FIGS. 16 and 17, the respective fan units 122 can be detachably united with the support frame 130. Further, in this case, a connector 155 for external connection is attached to a portion of the respective exterior pockets 140, in the lower part thereof, in such a way as to be supported by a stopper 159, and the connecting part 33 of the fan board 30, exposed in the lower part of the pocket 58 of the respective fan units 122, corresponds to the connector 155, so that upon mounting of the respective fan units 122, the connecting part 33 of the respective fan boards 30 is inserted into the respective connectors 155, thereby completing electrical connection therebetween. That is, at the same time when the respective fan units 122 are mounted, the respective connecting parts 33 are connected with the respective connectors 155.

As with the casing 2, the support frame 130 is formed of, for example, a thermoplastic or thermosetting synthetic resin but may be formed of a metal sheet.

As shown in FIG. 18 by way of example, a plurality of fixture members 160 are attached to an equipment member 158 such as a chassis, an exterior case, and so forth, of electronic equipment 156, and the respective fixture members 160 are provided with dents 162 formed so as to correspond to the fixture juts 152 of the support frame 130, respectively. By placing the respective fixture juts 152 of the support frame 130 so as to be opposed to the respective dents 162, and inserting the former into the latter, the support frame 130 can be attached to the equipment member 158 as shown in FIG. 19 by way of example. FIGS. 20A and 20B show a state where the fixture jut 152 is inserted in the respective dents 162 of the respective fixture members 160, and the support frame 130 is securely attached to the equipment member 158, exhibiting that the support frame 130 is firmly and securely attached to the equipment member 158. In this case, by disengaging the respective fixture juts 152 from the respective dents 162, the support frame 130 can be easily removed from the equipment member 158. Accordingly, the support frame 130 can be attached to, or detached from the equipment member 158 with ease.

Figure 21:
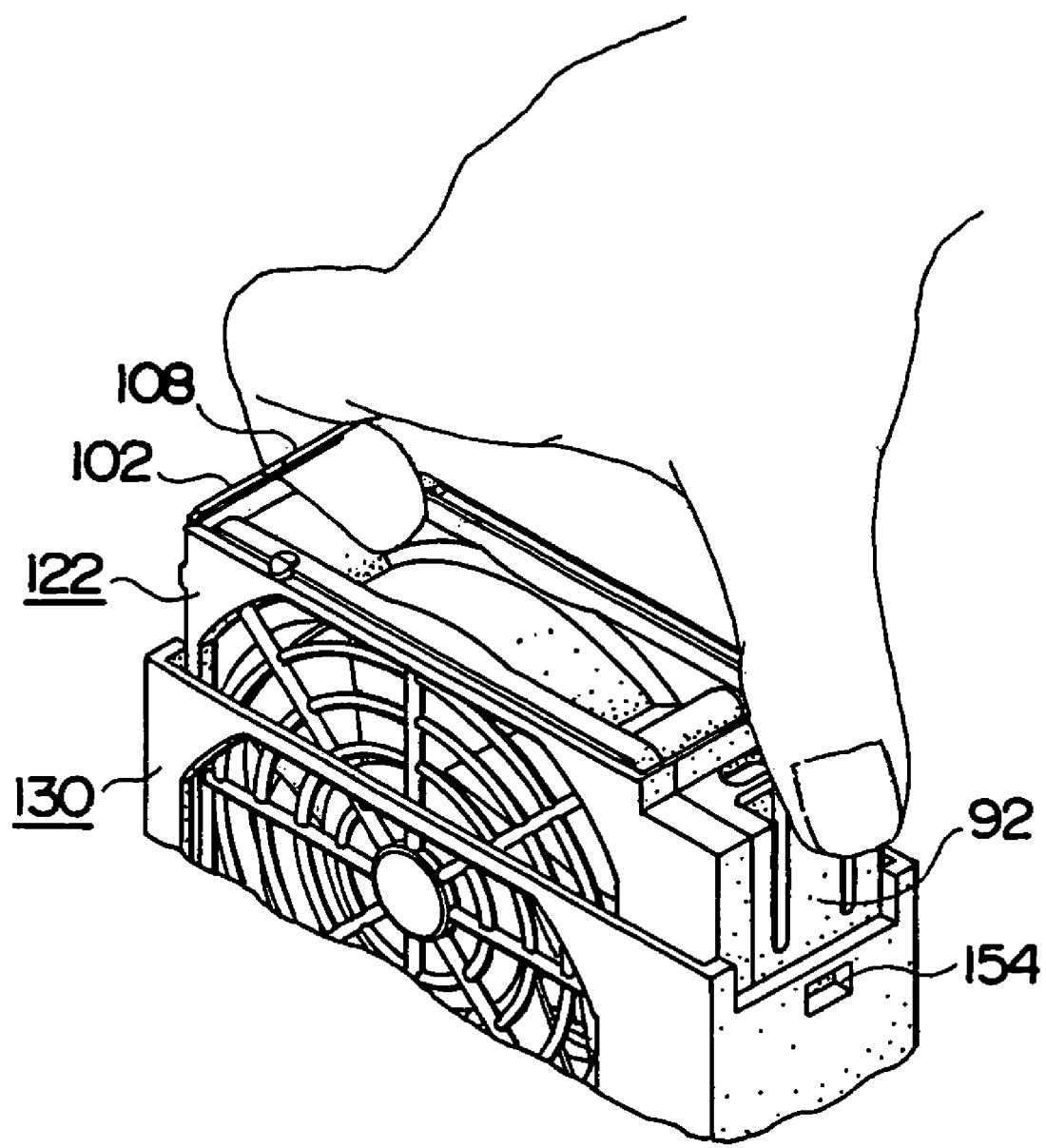
FIG. 21 is a view showing the operation of extracting the fan unit from the support frame.
Figure 22:
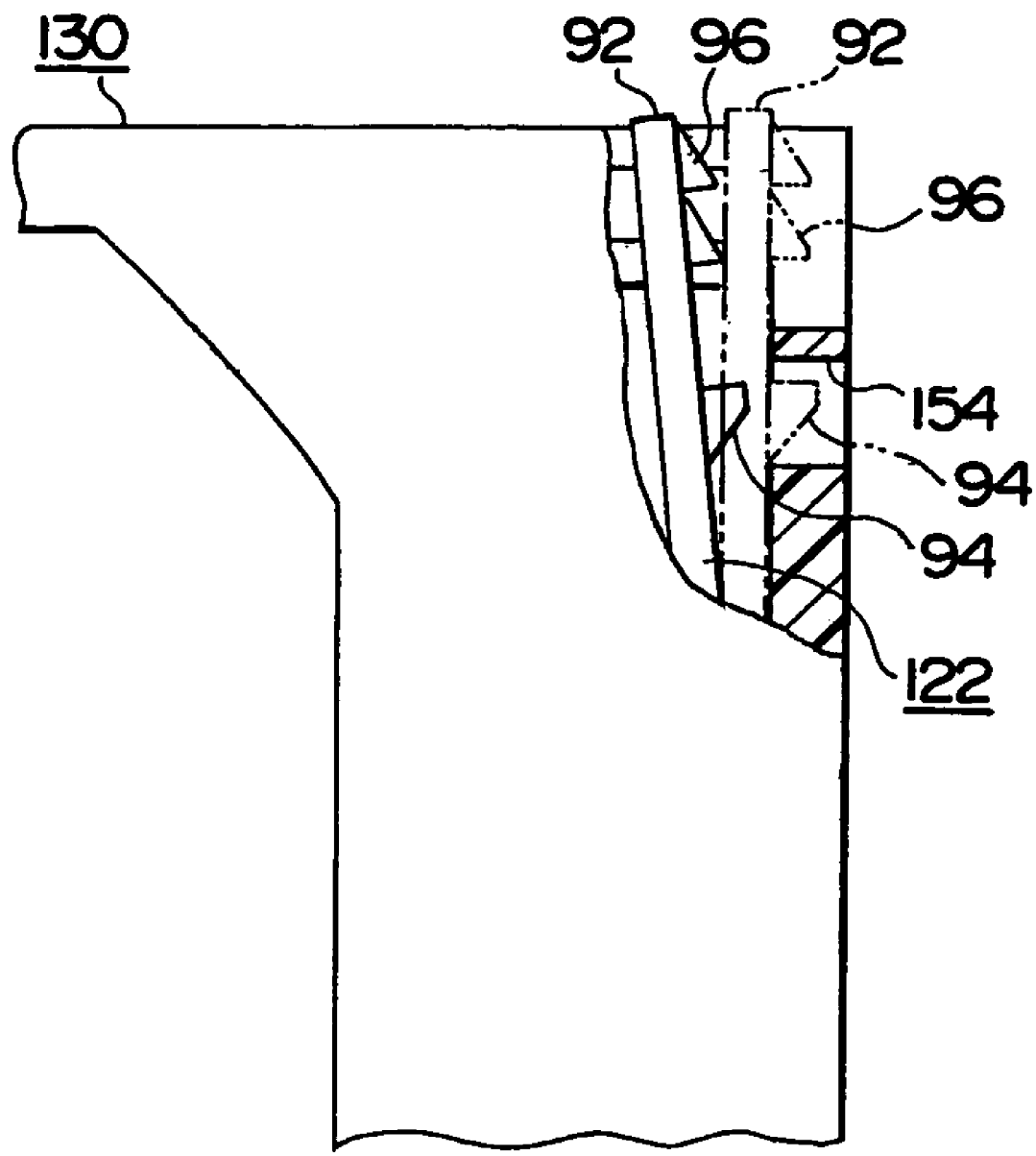
FIG. 22 is a view showing the moving state of the arm when the fan unit is extracted.

With the fan unit 122 mounted in the support frame 130, upon inserting a forefinger in the through-hole 108 of the pull 102 as raised, and putting a thumb on the protrusions 96 provided on the outer face of the arm 92, if a force is exerted between the forefinger and thumb in a direction in which both the fingers are caused to approach each other as shown in FIG. 21 by way of example, the arm 92 is curved, whereupon the fixture pawl 94 is disengaged from the fixture recess 154 as shown in FIG. 22. By pulling up the fan unit 122 while maintaining the state described, the fan unit 122 can be extracted from the support frame 130. That is, with the fixture pawl 94 of the arm 92 being engaged with the fixture recess 154, it is possible to maintain a state where the fan unit 122 is mounted in the respective housing cases 132, 134 of the support frame 130, so that the fan units 122 cannot be removed from the support frame 130, thereby maintaining a stable fixture state.

Figure 23:
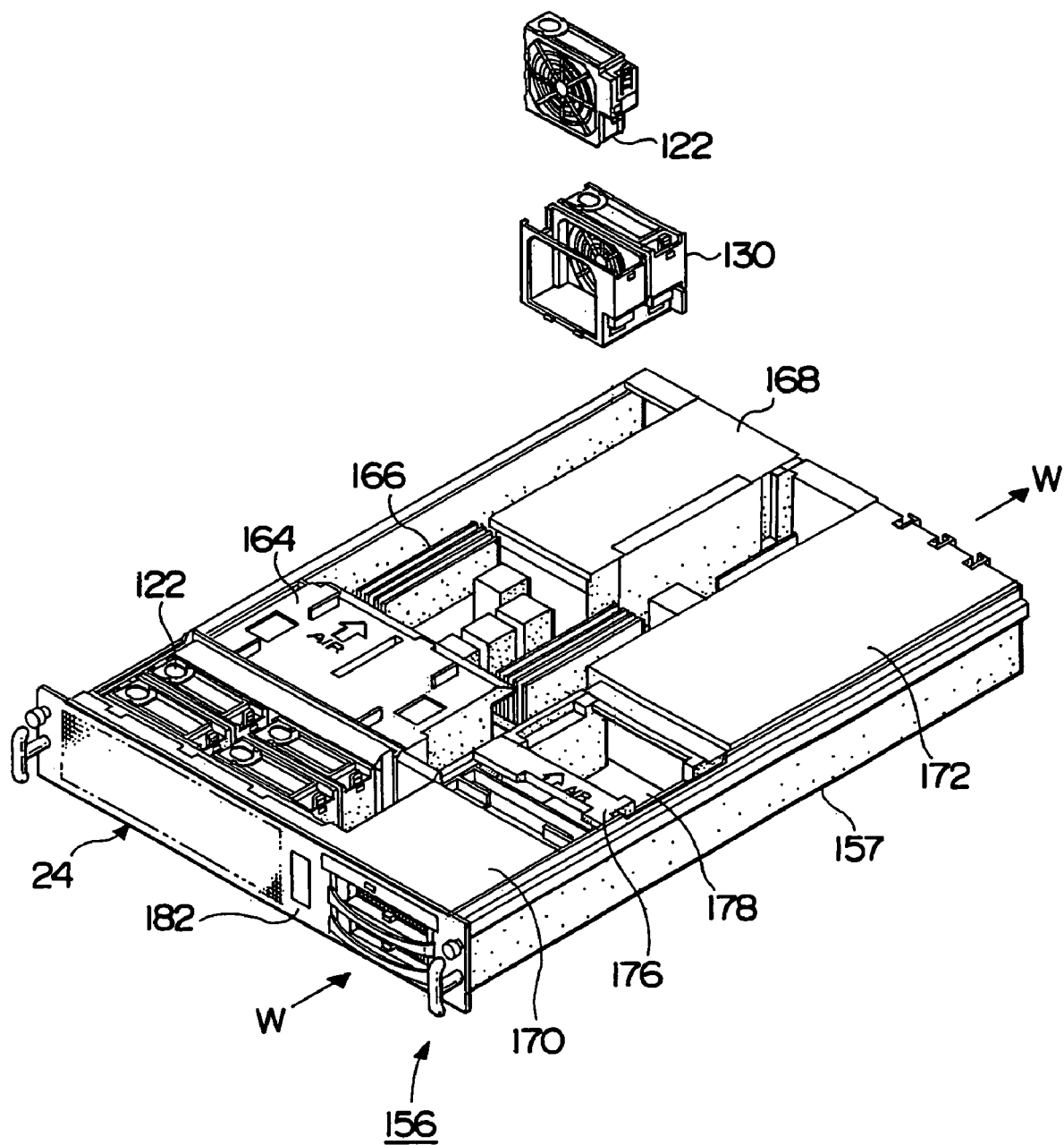
FIG. 23 is a perspective view showing the attachment of the support frame and the fan units in the electronic equipment.
Figure 24A:
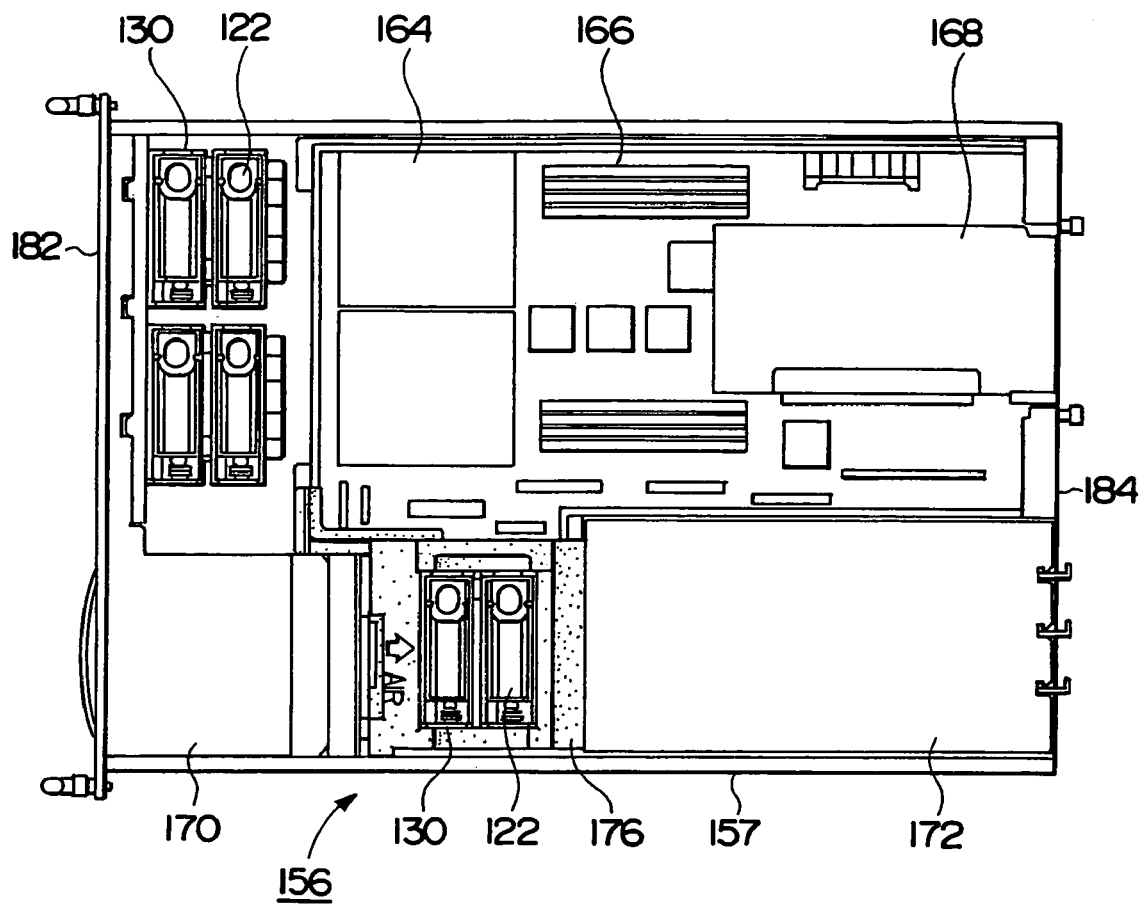
FIG. 24A is a plan view of the electronic equipment on which the fan units are mounted but a cover member is removed.
Figure 24B:
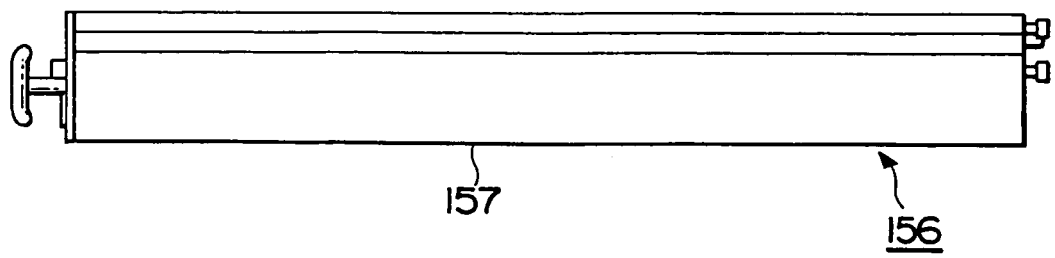
FIG. 24B is a side view of the electronic equipment on which the fan units are mounted.
Figure 26:
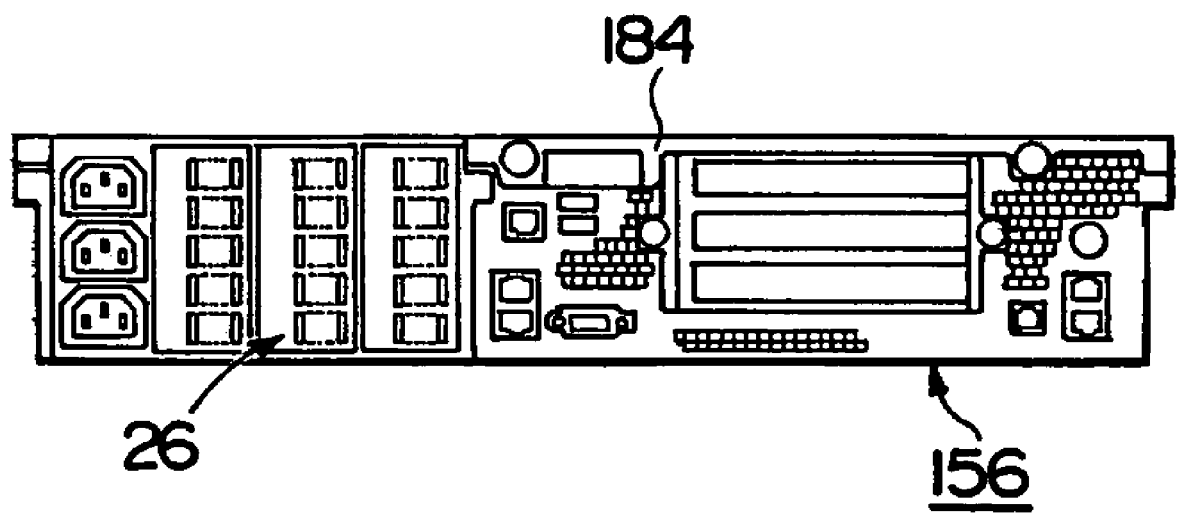
FIG. 26 is a rear view of the electronic equipment on which the fan units are mounted.

Now, an embodiment of electronic equipment according to the invention is described hereinafter with reference to FIGS. 23 through 26. FIG. 23 is a perspective view of the electronic equipment in the middle of assembling, FIG. 24A a plan view of the electronic equipment where the fan units together with the support frame are mounted, FIG. 24B a side view of the electronic equipment, FIG. 25 a front view of the electronic equipment, and FIG. 26 a rear view of the electronic equipment.

On the bottom of an exterior case 157 of the electronic equipment 156, there are installed a plurality of the fan units 122, a CPU 164, memories 166, a PCI 168, a hard disk 170, a power supply 172, and so forth, thereby constituting a server as an information processing equipment. With the electronic equipment 156, a duct unit 176 formed of a synthetic resin is installed between the hard disk 170 and the power supply 172, and a housing space 178 where the support frame 130 is to be installed is provided inside the duct unit 176. The duct unit 176 is installed in order to efficiently guide cooling air W from the hard disk 170 to the power supply 172.

On the inner face of the exterior case 157, exposed to the housing space 178, there are attached the fixture members 160 provided with the dents 162 formed at positions corresponding to the fixture juts 152 of the support frame 130, respectively, as shown in FIG. 18 by way of example, and the support frame 130 is detachably attached to the fixture members 160 as shown in FIG. 19 by way of example. Such a fixture state is as illustrated in FIGS. 20A, 20B shown previously. Thereafter, a lid member is attached to an opening of the exterior case 157, thereby completing an enclosed structure.

With the electronic equipment 156 made up as described above, while two units of the fan units 122, housed in the housing cases 132, 134 of the support frame 130, respectively, are maintained by the support frame 130, an air path is provided by the duct unit 176, there occurs flow of a cooling air W sucked in from an intake face 24 at a front panel 182 of the electronic equipment 156 due to rotation of the rotating blades 20 when driven by the fan motor 22 of the fan body 4 of either one or both of the fan units 122 toward the power supply 172 via the hard disk 170, and the cooling air W is released from an exhaust face 26 at a rear panel 184 of the electronic equipment 156, thereby cooling down both the hard disk 170 and the power supply 172. In this case, because heat generated on the hard disk 170 side is lower than that on the power supply 172 side, the power supply 172 is sufficiently cooled by the cooling air W guided from the hard disk 170 side.

Having extracted technical items from the above-described embodiment of the casing, equipment unit, fan unit, and electronic equipment, respectively, there are enumerated hereinafter technical significance thereof, variations thereof, other items of technical extension, and so forth.

The casing sections 36, 38, 40 of the casing 2 make up the linked body bendable along the respective hinge parts 42, and also a single exterior covering member at the same time. Those casing sections can make up, for example, the fan unit 122 if united with the fan body 4, and the equipment unit if united with the equipment body. For example, in the case of assembling the fan unit 122, that is, in the case of uniting the casing 2 with the fan body 4, fixture components such as screws, etc., and tools such as drivers, etc. are not required at all, so that assembling and disassembling can be implemented with ease. As shown in FIG. 1 through 7, the fan body 4 can be easily united with the casing sections 36, 38, respectively, with the use of the respective fitting parts 12. The casing section 36 can be coupled to the casing section 38 with the use of the coupling part 76 by securely attaching the fixture pawl 88 thereof to the fixture recess 82, both being easily detachable from each other. The number of steps for assembling and disassembling a finished product can be reduced with the use of the casing 2 as described above, thereby contributing to enhancement in productivity.

Since the casing sections 36, 38, 40 can be formed of a molding material such as a synthetic resin or the like so as to be small in wall thickness, there occurs no increase in volume of the fan unit 122 or the equipment unit as compared with the equipment body such as the fan body 4, and so forth.

Since the vent 48 of the casing sections 36, 38, respectively, is provided with the finger guard 50, intrusion of fingers, and so forth can be prevented, so that a conventional finger guard made up of wire is no longer necessary, thereby enabling the fan unit 122 to be simplified in construction. The finger guard 50 may be installed in either of the casing sections 36, and 38. As with the present embodiment of the invention, if the finger guard 50 is installed in both the casing section opposite to the intake face 24 of the fan body 4 and the other casing section opposite to the exhaust face 26, the fan body 4 can be attached to the casing 2 irrespective of the direction of air flow of the fan body 4.

Due to fitting of the casing sections 36, 38 to the fan body 4, and coupling between the casing section 36 and the casing section 38, the fan board 30 is retained by the retainers 64, 66 of the pocket 58. Since the connecting part 33 of the fan board 30 is exposed in the lower part of the pocket 58, so that connection of the fan board 30 with an external circuit can be easily implemented with the fan board 30 being retained by the pocket 58.

The casing 2 can be easily formed of a thermosetting or thermoplastic synthetic resin by integral molding. Further, since the hinge parts 42, 104 can be easily formed so as to be smaller in wall thickness than the casing sections 36, 38, 40, and the pull 102 by a molding process using molding dies, desired bending characteristics and bending strength can be attained by taking advantage of flexibility of the synthetic resin. In this case, by using the bearing part formed of the synthetic resin or the like and attaching the pivot pin thereto at the respective hinge parts 42, and the hinge part 104, the respective casing sections 36, 38 are bendable relative to the casing section 40, and the pull 102 is also bendable relative to the casing section 40.

If a synthetic resin is used as the constituent material of the casing 2, electromagnetic shielding of the casing sections 36, 38, 40 can be attained by mixing an electrically conductive material in the synthetic resin. In another method of implementing electromagnetic shielding of the casing sections 36, 38, 40, the electromagnetic shielding thereof can be similarly attained by applying vapor deposition of an electrically conductive material to the inner or outer surface of the casing sections 36, 38, 40, respectively.

With the present embodiment, although the fan unit 122 is made up by covering the fan body 4 with the casing 2, the equipment body of other electronic equipment can be detachably united with the casing 2 by covering the equipment body with the casing without using fixture components, tools, and so forth, so that the equipment body other than the fan unit 122 can be made up with ease.

The pull 102, for example, as shown by chain doubled-dashed line in FIG. 14, can be pulled up from the upper face of the fan unit 122 with a finger, etc., and the fan unit 122 can be caught up by inserting a finger in the through-hole 108 thereof and holding the arm 92 opposite to the through-hole 108 by another finger. If such a pull 102 is provided, similar operation can be performed in other equipment unit as well as the fan unit 122.

Figure 12A:
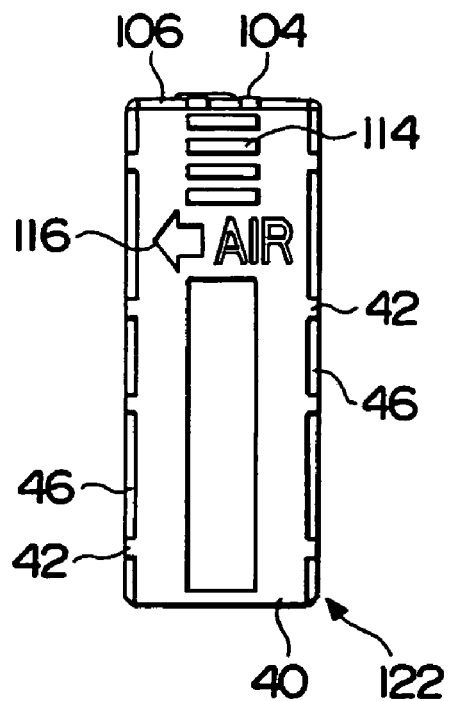
FIG. 12A shows the fan unit in a left side view.
Figure 12B:
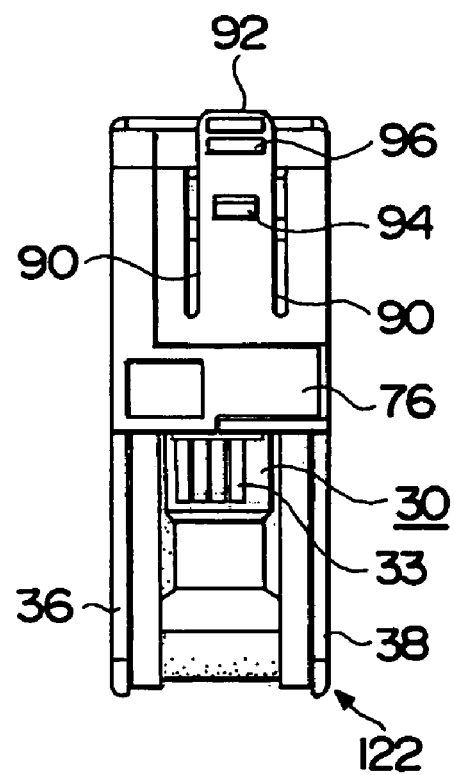
FIG. 12B shows the fan unit in a right side view.

In the case where each of the casing sections 36, 38 is opposed to each other, for example, as shown in FIG. 3 and FIG. 12B, the fan board 30 is held between each of the casing sections 36, 38. The thus held fan board 30 is held in parallel with the side face 44 of the fan body 4.

With use of the support frame 130 in the same manner as the embodiment, if the housing space 178 in which the support frame 130 is attached to the electronic equipment 156 is secured, an equipment unit such as the fan unit 122 and so forth can be attached to, or detached from the electronic equipment 156 by the support frame 130 with ease without using tools. Further, the attachment structure of the electronic equipment 156 attained by such the support frame 130 reduces the wasted space to increase the mounting efficiency, thereby contributing to downsizing of the electronic equipment 156. In this case, a plurality of fan units 122 can be installed together, so that if one fan unit is broken down, the fan unit 122 can be attached to, or detached from the casing with ease by removing a cover member, not shown, which is attached to, or detached from the exterior case 157.

With the present embodiment, although information processing equipment such as server equipment serving as electronic equipment 156 and so forth is exemplified, the invention can be applied to various equipment and devices such as communication equipment and so forth, which requires cooling by cooling air W.

With the present embodiment, although the fan board 30 made up of a printed wiring board is used, a hybrid IC may be installed instead of the fan board 30.

As described in detail above, although the invention has been described with reference to the most preferable embodiment, the invention is not limited thereto, and needless to say that various modifications and changes can be made by a person skilled in the art based on the gist of the invention as disclosed in claims, the detailed description of the invention, and such modifications and changes are included in the scope of the invention.

The entire disclosure of Japanese Patent Application No. 2003-19431 including specification, claims, drawings and summary are incorporated herein by reference in its entirety.

What is claimed is:

1. A casing comprising:

a first casing section;

a second casing section;

a third casing section, provided between the first casing section and the second casing section, that is bendably held by the first casing section via a first hinge part, and is bendably held by the second casing section via a second hinge part; and a coupling part for implementing detachable coupling between the first casing section and the second casing section, wherein the first, the second and the third casing sections, the first and the second hinge parts, and the coupling part are formed in one piece;

wherein the first and the second hinge parts are formed to be thinner than the first, the second and the third casing sections, and are provided with slits, and wherein the coupling part is made up of a fixture pawl provided in one of the first and the second casing sections to be coupled, and a recess provided in the other casing section thereof, for securely holding the fixture pawl.

2. A casing according to claim 1, wherein the coupling part includes a first butting part provided on the first casing section and a second butting part provided on the second casing section and corresponding to the first buffing part, and wherein the first butting part is butted against the second butting part when the fixture pawl is fixedly attached to the recess.

3. A casing comprising:

first and second casing sections covering faces of an equipment body;

a fitting part for detachably fitting at least one of the first and second casing sections to the equipment body;

a third casing section that is provided between the first casing section and the second casing section, the third casing section being bendably held by the first casing section via a first hinge part, and being bendably held by the second casing section via a second hinge part, the first and the second hinge parts being formed to be thinner than any of the first, the second and the third casing sections, and being provided with slits;

a fixture pawl protruded from the first casing section; and a fixture recess formed in the second casing section, for detachably and securely holding the fixture pawl thereto.

4. An equipment unit comprising:

an equipment body;

a casing enclosing a plurality of faces of the equipment body, and installed in the equipment body, the casing including:

a first casing section;

a second casing section;

a third casing section, provided between the first casing section and the second casing section, that is bendably held by the first casing section via a first hinge part, and is bendably held by the second casing section via a second hinge part;

the first and the second hinge parts formed to be thinner than the first, the second and the third casing sections, and provided with slits; and a coupling part for implementing detachable coupling between the first casing section and the second casing section, and a fitting part for detachably fitting the casing and the equipment body to hold the casing by the equipment body, wherein the first, the second and the third casing sections and the fitting part are formed in one piece, and wherein the coupling part is made up of a fixture pawl provided in one of the first and the second casing sections to be coupled, and a recess provided in the other casing section thereof, for securely holding the fixture pawl.

5. An equipment unit, comprising:

an equipment body;

first, second and third casing sections corresponding to a plurality of faces of the equipment body for constituting a casing for covering the faces, the third casing section being provided between the first casing section and the second casing section;

a fitting part for detachably fitting at least one casing section of the first and the second casing sections and the equipment body;

a first hinge part for bendably supporting between the first casing section and the third casing section;

a second hinge part for bendably supporting between-the second casing section and the third casing section; and a coupling part for detachably coupling between the first casing section and the second casing section, wherein the first, the second and the third casing sections, the fitting part, the first and the second hinge parts, and the coupling part are formed in one piece, wherein the first and the second hinge parts are formed to be thinner than the first, the second and the third casing sections, and are provided with slits, and wherein the coupling part is made up of a fixture pawl provided in one of the first and the second casing sections to be coupled, and a recess provided in the other casing section thereof, for securely holding the fixture pawl.

6. A fan unit, comprising:

a fan body;

a casing enclosing either or both of an intake face or an exhaust face of the fan body, the casing including:

a first casing section;

a second casing section;

a third casing section, provided between the first casing section and the second casing section, that is bendably held by the first casing section via a first hinge part, and is bendably held by the second casing section via a second hinge part, the first and the second hinge parts being formed to be thinner than the first, the second and the third casing sections, and being provided with slits;

a fitting part for detachably fitting the casing and the fan body to hold the casing on the fan body; and a ventilation part formed on the casing, wherein the casing, the fitting part, and the ventilation part are formed in one piece.

7. A fan unit, comprising:

a fan body;

first, second and third casing sections constituting the casing for covering the faces corresponding to a plurality of faces of the fan body, the third casing section being provided between the first casing section and the second casing section;

a ventilation part formed on at least one casing section of the first and the second casing sections;

a first hinge part for bendably supporting between the first casing section and the third casing section;

a second hinge part for bendably supporting between-the second casing section and the third casing section; and a coupling part for detachably coupling between the first casing section and the second casing section, and wherein the first, the second and the third casing sections, the ventilation part, the first and the second hinge parts, and the coupling part are formed in one piece; and wherein the first and the second hinge parts are formed to be thinner than the first, the second and the third casing sections, and are provided with slits.

8. A fan unit, comprising:

a fan body;

a casing enclosing either or both of an intake face or an exhaust face of the fan body and installed in the fan body, the casing including:

a first casing section;

a second casing section;

a third casing section, provided between the first casing section and the second casing section, that is bendably held by the first casing section via a first hinge part, and is bendably held by the second casing section via a second hinge part, the first and the second hinge parts being formed to be thinner than the first, the second and the third casing sections and being provided with slits;

a fitting part for detachably fitting the casing and the fan body to hold the casing on the fan body;

an indicator for indicating an operation of the fan body; and a window for checking the indicator.

9. A fan unit, comprising:

a fan body;

a casing enclosing either or both of an intake face or an exhaust face of the fan body and installed in the fan body, the casing including:

a first casing section;

a second casing section;

a third casing section, provided between the first casing section and the second casing section, that is bendably held by the first casing section via a first hinge part, and is bendably held by the second casing section via a second hinge part, the first and the second hinge parts being formed to be thinner than the first, the second and the third casing sections, and being provided with slits;

a ventilation part provided on either or both of the intake face or the exhaust face of the fan body in the casing; and a printed wiring board held between retainers of the first and the second casing sections constituting the casing.

10. A fan unit, comprising:

a fan body;

a casing enclosing either or both of an intake face or an exhaust face of the fan body, installed in the fan body, and including:

a first casing section;

a second casing section;

a third casing section, provided between the first casing section and the second casing section, that is bendably held by the first casing section via a first hinge part, and is bendably held by the second casing section via a second hinge part, the first and the second hinge parts being formed to be thinner than the first, the second and the third casing sections, and being provided with slits, the casing comprising a pocket for holding a printed wiring board thereon.

11. A fan unit, comprising:

a fan body;

a casing enclosing either or both of an intake face or an exhaust face of the fan body, installed in the fan body and being able to attain electromagnetic shielding function, and including:

a first casing section;

a second casing section;

a third casing section, provided between the first casing section and the second casing section, that is bendably held by the first casing section via a first hinge part, and is bendably held by the second casing section via a second hinge part, the first and the second hinge parts being formed to be thinner than the first, the second and the third casing sections and being provided with slits.

12. An electronic equipment provided with an exterior case, comprising:

a support member detachably attached to the exterior case a housing case formed in the support member;

an equipment unit to be detachably housed in the housing case, the equipment unit having an equipment body and a casing enclosing a plurality of faces of the equipment body and installed detachably in the equipment body, the casing having a plurality of casing sections and a hinge part bendably linking respective casing sections, the hinge part being formed to be thinner than the respective casing sections and being provided with slits; and a fixture pawl provided in a casing of the equipment unit to be movable back and forth for fixing the equipment unit to the housing case.

13. A casing comprising:

a first casing section;

a second casing section;

a third casing section, provided between the first casing section and the second casing section, that is bendably held by the first casing section via a first hinge part, and is bendably held by the second casing section via a second hinge part; and a coupling part for implementing detachable coupling between the first casing section and the second casing section; and a pull that is bendably held by a top edge of the third casing section via a third hinge part, the pull in which a through hole is formed, wherein the first, the second and the third casing sections, the first and the second hinge parts, and the coupling part are formed in one piece, and wherein the first and the second hinge parts are formed to be thinner than the first, the second and the third casing sections, and are provided with slits.

* * * * *

UNITED STATES PATENT AND TRADEMARK OFFICE
CERTIFICATE OF CORRECTION

PATENT NO. : 7,661,923 B2  Page 1 of 1
APPLICATION NO. : 11/295522
DATED : February 16, 2010
INVENTOR(S) : Naofumi Kosugi It is certified that error appears in the above-identified patent and that said Letters Patent is hereby corrected as shown below:

Cover Page, Column 2 (Abstract), Line 7, change "hosing" to --housing--.

Column 15, Line 13, change "buffing" to --butting--.

Column 16, Line 6, change "between-the" to --between the--.

Column 16, Line 51, change "between-the" to --between the--.

Column 18, Line 19, after "case" insert --;--.

Signed and Sealed this

Eighteenth Day of May, 2010

David J. Kappos
*Director of the United States Patent and Trademark Office*